(12) United States Patent
Conoci et al.

(10) Patent No.: US 8,017,221 B2
(45) Date of Patent: Sep. 13, 2011

(54) ORGANIC ELECTRICALLY BISTABLE MATERIAL AND ITS USE FOR PRODUCING A MEMORY SWITCH

(75) Inventors: Sabrina Conoci, Tremestieri Etneo (IT); Salvatore Petralia, Modica (IT); Riccardo Sotgiu, Solbiate Olona (IT); Agostino Pirovano, Corbetta (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 1427 days.

(21) Appl. No.: 11/438,916

(22) Filed: May 22, 2006

(65) Prior Publication Data
US 2007/0007513 A1   Jan. 11, 2007

(30) Foreign Application Priority Data

May 20, 2005 (EP) .................................... 05011005
Sep. 16, 2005 (EP) .................................... 05020196

(51) Int. Cl.
*B32B 3/00* (2006.01)
*G11C 11/00* (2006.01)
(52) U.S. Cl. ............... 428/195.1; 257/40; 257/E51.025; 257/E51.048; 257/E51.05; 365/148
(58) Field of Classification Search ............... 428/195.1, 428/690, 702, 913; 257/40, E51.025, E51.048, 257/E51.05; 365/119, 148, 151, 154
See application file for complete search history.

(56) References Cited

U.S. PATENT DOCUMENTS

| | | | |
|---|---|---|---|
| 3,359,521 A * | 12/1967 | Lew et al. ........................ 338/20 |
| 4,400,255 A | 8/1983 | Kisner et al. | |
| 4,431,883 A | 2/1984 | Frank | |
| 4,507,662 A | 3/1985 | Rothenberg et al. | |
| 4,574,366 A | 3/1986 | Potember et al. | |
| 4,652,894 A | 3/1987 | Potember et al. | |
| 4,731,756 A | 3/1988 | Potember et al. | |
| 4,924,009 A * | 5/1990 | Neckers et al. ................ 549/223 |

(Continued)

FOREIGN PATENT DOCUMENTS

CN     1239329 A     12/1999
(Continued)

OTHER PUBLICATIONS

STN search of sulfonylium cations prepared on Feb. 9, 2011.*

(Continued)

*Primary Examiner* — Mark Ruthkosky
*Assistant Examiner* — Gerard T Higgins
(74) *Attorney, Agent, or Firm* — Dylan O. Adams; Graybeal Jackson LLP

(57) ABSTRACT

Disclosed is a fluoresceine derivative having the following formula:

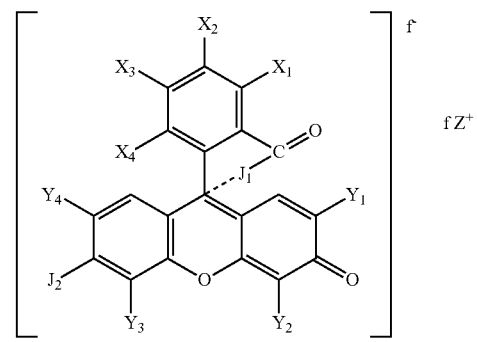

for the production of an electronic device, in particular a memory switch.

25 Claims, 13 Drawing Sheets

U.S. PATENT DOCUMENTS

| | | | | |
|---|---|---|---|---|
| 5,009,958 | A * | 4/1991 | Yamashita et al. | 428/411.1 |
| 7,238,964 | B2 * | 7/2007 | Walter et al. | 257/59 |
| 7,482,621 | B2 * | 1/2009 | Yang et al. | 257/40 |
| 2004/0027849 | A1 | 2/2004 | Yang et al. | |
| 2004/0246770 | A1 * | 12/2004 | Kano | 365/154 |

FOREIGN PATENT DOCUMENTS

| | | |
|---|---|---|
| CN | 1333571 A | 1/2002 |
| CN | 1344719 A | 4/2002 |
| CN | 1352470 A | 6/2002 |
| CN | 1363936 A | 8/2002 |
| EP | 1724851 A1 | 11/2006 |
| WO | 0237500 A1 | 5/2002 |

OTHER PUBLICATIONS

Potember et al (1982) "A Current-Controlled Electrically-Switched Memory State in Silver and Copper-TCNQF4 Radical-Ion Salts"; Synth. Met.; 4:371.

Ma et al. (2002) "Organic Electrical Bistable Devices and Rewritable Memory Cells"; Appl. Phys. Lett.; 80(16):2997.

Ma et al. (2003) "Nonvolatile Electrical Bistability of Organic/Metal-Nanocluster/Organic System"; Appl. Phys. Lett.; 82:1419.

Li et al. (2000) "Parallel Molecular Stacks of Organic Thin Film With Electrical Bistability"; Appl. Phys. Lett.; 76:2352.

Hua et al. (2001) "New Organic Bistable Films for Ultrafast Electric Memories"; Appl. Surface Science; 169-170:447.

Xue et al. (1996) "Electrical Switching and Memory Phenomena in the AG-BDCP Thin Film"; Thin Solid Film; 288:296.

Ma et al. (2000) "Organic Reversible Switching Devices for Memory Applications"; Advanced Materials; 12:1063.

Potember et al. (1982) "Electrical Switching and Memory Phenomena in CU-TCNQ Thin Films"; Appl. Phys. Lett.; 34:405.

Xu et al. (1995) "Two New All-Organic Complexes With Electrical Bistable States"; Appl. Phys. Lett.; 67:2241.

Oyamada et al. (2003) "Switching Effect in CU:TCNQ Charge Transfer-Complex Thin Films by Vacuum Codeposition"; Appl. Phys. Lett.; 83:1253.

Gong et al. (1992) "Preparation of Polymeric Metal-Tetracyanoquinodimethane Film and Its Bistable Switching"; Appl. Phys. Lett; 61:2787.

Watanabe et al. (1991) "Negative-Resistance Effect in Rubidium Tetracyanoquinodimethane (RB-TCNQ)"; Phys. Rev. B; 44:11111.

Sezi et al. (2003) "Organic Materials for High-Density Non-Volatile Memory Applications"; IEEE International Electron Devices Meeting, Paper #10.2.

Potember et al. (1981) "The Vibrational and X-Ray Photoelectronic Spectra of Semiconducting Copper-TCNQ Films"; Chem. SCR.; 17:219.

Potember et al. (1986) "Molecular Electronics"; Johns Hopkins APL Tech. Dig.; 7:129.

European Search Report, EP05020196, Nov. 21, 2005.

Ahmed, Fariyal, et al., Synthesis and Application of Fluorescein-Labeled Pleuronic Block Copolymers to the Study of Polymer-Surface Interactions, Langmuir, vol. 17, pp. 537-546, 2001.

Alcantara, Ramon, et al., Photoxidation of ethylbenzene with air Catalyzed by a polymer Supported Rose Bengal Photosensitizer, J. Photochem. and photobio., pp. 27-32, 2000.

Bandhopadhyay, A., et al., Large Conductance Switching and Binary Operation in Organic Devices: Role of Functional Groups, J. Phys. Chem., vol. 107, No. 11, pp. 2531-2536, Feb. 26, 2003.

Bandhopadhyay, A., et al., Tuning of Organic Reversible Switching via Self-Assembled Supramolecular Structures, Advanced Materials, vol. 15, No. 22, pp. 1949-1952, Nov. 17, 2003.

Bandhopadhyay, A., et al., Memory Switching Phenomenonin Acceptor-Rich Organic Molecules: Impedence Spectroscopic Studies, J. Phys. Chem., vol. 109, pp. 6084-6088, 2005.

Bandhopadhyay, A., et al., Large Conductance Switching and Memory Effects in organic Molecules for Data-Storage Applications, Applied Physical Letters, vol. 82, No. 8, pp. 1215-1217, Feb. 24, 2003.

Brunner, Jens, et al., Copper(II)-Quenched Oligonucleotide Probes for Fluorescent DNA Sensing, J. Am. Chem. Soc., vol. 126, pp. 13626-13627, 2004.

Carreon, Jay R., et al., Synthesis, Charachterization, and Cellular Uptake of DNA-Binding Rose bengal Peptidoconjugates, Organic Letters, vol. 7, No. 1, pp. 99-102, 2005.

Cecchi, Alessandro, et al., Carbonic Anhydrase Inhibitors. Design of Fluorescent Sulfonamides as Probes of Tumor-Associated Carbonic Anhydrase IX Inhibit Isozyme IX-Mediated Acidification of Hypoxic Tumors, J. Med., Chem., vol. 48, pp. 4831-4841, 2005.

Chen, Cian-An, et al., Design and Synthesis of a Fluorescent Reporter of Protein Kinase Activity, J. Am. Chem. Soc., vol. 124, pp. 3840-3841, 2002.

Clark, Matthew, et al., Synthesis and Metal-Binding Properties of Chelating Fluorescein Derivatives, organic Letters, vol. 5, No. 12, pp. 2051-2054, 2003.

Cong, Rongjuan, et al., A New Synthesis of Fluorescin Isothiocyanate labeled Poly (styrenesulfonate sodium salt), Macromolecules, vol. 37, pp. 4731-4635, 2004.

Gao, Jianxin, et al., Xanthamide Fluorescent Dyes, Anal. Chem., vol. 74, 6397-6401, 2002.

Guo, Xuefeng, et al., Synthesis and Spectral Investigations of a New Dyad with Spiropyran and Fluorescein units: Toward Information Processing at the Single Molecular Level, J. Org. Chem., vol. 68, pp. 5681-5687, 2003.

Kamat, Prashant, et al., Photophysics and photochemistry of Xanthene Dyes in polymer Solutions and Films, J. Phys. Chem., vol. 88, pp. 2297-2302, 1984.

Linden, Shwn Meei, et al., Bleaching Studies of Rose bengal Onium Salts, J. Am., Chem., vol. 110, pp. 1257-1260, 1988.

Madea, Hatsuo, et al., A Design of Fluorescent Probes for Superoxide Based on a Nonredox Mechanism, J. Am. Chem. Soc., vol. 127, pp. 68-69, 2005.

Metallo, Steven J., et al., Using Bifunctional Polymers Presenting vancomycin and Fluorescein Groups to Direct Anti-Fluorescein Antibodies to Self-Assembled Monolayers Presenting D-Alanine-D-Alanine Groups, J. Am. Chem. Soc., vol. 125, pp. 4534-4540, 2003.

Millar, David, et al., Electrochemical Immobilization of a PH Sensitive Fluorescein Derivative:Synthesis and Charachterization of a Fluorescein-Derivatised Polythiophene, Chem. Commun., pp. 477-478, 1998.

Miura, Tetsuo, et al., Rational Design Principle for Modulating Fluorescence Properties of Fluorescein-Based Probes by Photoinduced Electron Transfer, J. Am. Chem. Soc., vol. 125, pp. 8666-8871, 2003.

Mokhir, Andriy, et al., Fluorescent Sensor for CU2+ with a Tunable Emission Wavelength, inorg. Chem, 2005.

Neckers, D.C., Rose Bengal, J. Photochem. and Photobio., vol. 47, pp. 1-29, 1989.

Nicol, E., et al., Layer-by-Layer Self-Assembly of Polyelectrolyte and the Divalent Salt of Fluorescein, J. Photochem. and Photobio., vol. 167, pp. 31-35, 2004.

Nolan, Elizabeth M., et al., Synthesis and Charachterization of Zinc Sensors Based on a Monosubstituted Fluorescein Platform, Inorganic Chemistry, vol. 43, No. 8, pp. 2624-2635; 2004.

Oberg, Christopher Tt., et al., Efficient and Expedient Two-Step Pyranose-Retaining Fluorescein Conjugation of Complex Reducing Oligosaccharides: Galectin Oligosaccharide Specificity Studies in a Fluorescence Polarization Assay, Bioconjugate Chem., vol. 14, pp. 1289-1297, 2003.

Peng, Xing Yue (Larry), et al., A Three-Dimensional Flow Control Concept for Single-Cell Experiments on a Microchip. 2. Fluorescein Diacetate metabolism and Calcium Mobilization in a Single Yeast Cell as Simulated by Glucose and pH Changes, Analytica Chemistry, vol. 76, No. 18, pp. 5282-5292, 2004.

Pirovano, A., et al., Organic Electrically Bistable Materials for Non-Volatile Memory Applications, Central R&D, NVMTD., STMIcroelectronics, Post Silicon Technology, FTM, 2005.

Sanchez, Eduardo, I., et al., Synthesis of a New Polymer Containing Rose Bengal, Polymer Bulletin 51, pp. 271-275, 2004.

Sparano, Brian A., et al., Effect of Binding and Conformation on Fluorescnce Quenching in New 2', 7'—Dichlorofluorescein Derivatives, American Chemical Society, Organic Letters, vol. 6, No. 12, pp. 1947-1949, 2004.

Ueno, Tasuku, et al., Rational Principals for Modulating Fluorescence Properties of Fluorescein, J. Am. Chem. Soc., vol. 126, pp. 14079-14085, 2004.

Wolfbauer, Georg, et al., A Channel Flow Cell System Specifically Designed to Test the Efficiency of Redox Shuttles in Dye Sensitized Solar Cells, Solar Energy Materials & Solar Cells, vol. 70, pp. 85-101, 2001.

Zhang, Haiping, et al., Photoinduced Charge Separation Across Colloidal TiO2 and Fluorescein Derivatives, J. Phys. Chem. B., vol. 1-6, pp. 9597-9603, 2002.

* cited by examiner (a) not annealed BR-TEA film (b) annealed BR-TEA film

(a) not annealed BR-Na film

(b) annealed BR-Na film

ORGANIC ELECTRICALLY BISTABLE MATERIAL AND ITS USE FOR PRODUCING A MEMORY SWITCH

PRIORITY CLAIM

This application claims priority from European patent application Nos. 05011005.5 filed on May 20, 2005, and 05020196.1 filed Sep. 16, 2005, which are incorporated herein by reference.

TECHNICAL FIELD

The present invention relates, in its more general aspect, to compounds having the property of being electrically bistable, namely the property of exhibiting voltage-induced conductance switching.

In particular, an aspect of the present invention relates to Organic Electrically bistable (OEB), and more in particular electrically bistable fluoresceine derivatives.

Another aspect of the present invention further relate to the use of electrically bistable fluoresceine derivatives for producing electronics components, and in particular memory switches for high density memories applications.

A further aspect of the present invention relates to a method for producing switch memories for the production of memory devices.

BACKGROUND

Organic Materials showing electrically bistable behavior are very attractive for the developing of low cost, high density non volatile memory devices.

Organic Electrically Bistable Materials (OEBMs) can be defined as materials able to have a stable and reversible form upon either charge injection or charge extraction processes.

More exactly, in these materials when upon electrical stimuli the so-called threshold voltage Vth is reached, the resistivity switches from a low (high) to a high (low) value.

Thus, this phenomenon allows the material to exhibit two states of different conductivities at the same applied voltage.

FIG. 1 clearly shows one of the typical switching characteristics of organic electrically bistable materials based upon voltage variations.

The above property makes these materials appealing candidates for use in non-volatile memory applications. Indeed, in comparison to inorganic materials, organic materials allow the tuning of their properties by appropriate syntheses, to be low cost materials and also easy to process materials.

By examining the prior art on OEBMs, these materials can be grouped in the following main classes: Charge Transfer complexes, Organic Composite systems developed by UCLA University, Simple Organic Molecules, Polymers and Disodium salts of fluoresceine-based dyes, DDQ (2,3-dichloro-5-6-dicyano-1,4-benzoquinone) and TAPA ((+)-2-(2,4,5,7-tetranitro-9-fluorenylideneaminooxy)propionic acid).

Charge Transfer (CT) Complexes are composed by a D-A system featured by:

D=metals with low ionization potential such as Cu, Ag, etc. or organic molecules such as e.g. tetrathiafulvalene (TTF)

A=organic molecules such as e.g. tetracyanoquinodimethane (TCNQ), toluoylene dicarbamidonitrite (TDCN) etc. . . .

The use of CT complexes for producing switching device is known for example from the following six patents: U.S. Pat. No. 4,371,883; U.S. Pat. No. 4,507,662; U.S. Pat. No. 4,574,366; U.S. Pat. No. 4,652,894; U.S. Pat. No. 4,731,756; and Japanese Patent Publication No. 2001-345431.

Moreover, Cu:TCNQ CT complex has been extensively studied during the last twenty years by Potember et al. [R. S. Potember et al., Chem. Scr. 17, 219, 1981; Appl. Phys. Lett. 34, 405, 1982; 7 R. S. Potember, T. O. Poehler, A. Rappa, D. O. Cowan, and A. N. Bloch, Synth. Met. 4, 371, 1982. R. S. Potember et al., APL Techn. Dig. 1986, 7, 129; Appl. Phys. Lett. 1995, 67, 2241 and refs therein] and interesting results as materials for high-density memories devices have been found. Basically, these molecules show good stability and fast switching behavior at room temperature with ease processability (evaporation).

Nevertheless, these materials present some unsolved technological issues that block their employment in memory devices. Firstly, the electrical behavior of these materials have generally been found to be unstable, not reproducible and are strictly dependent on both structures and uniformity of films.

Several methods have been proposed to obtain a precise control of CT film structures [T. Oyamada et al., Appl. Phys. Lett., 2003, 83, 1253 and refs therein]. Secondly, the migration of Cu in the electrode materials has been also found with consequent contamination device problems.

Similar behavior to Cu:TCNQ has been also demonstrated for the compounds Ag:TCNQ [R. S. Potember et al., APL Techn. Dig. 1986, 7, 129; Appl. Phys. Lett. 1995, 67, 2241 and refs therein], Li:TCNQ [A. J. Gong and Y. Osada, Appl. Phys. Lett., 1992, 61, 2787], Ru:TCNQ [N. Watanabe et al., Phys. Rev. B, 1991, 44, 111]

Going on to CT complexes review, Xu et al. reports on electrically bistable behavior of all-organic D-A complexes composed by Melanine cyanurate (MC)+TCNQ and bis[2-butene-2,3-dithiolato(2-)-s.s']-Ni (BBDN) TCNQ, respectively [W. Xu et al., Appl. Phys. Lett., 1995, 67, 2241]. The use of MC and BBDN instead of Cu avoid the surface Cu migration. The electrical tests showed transition time from high to low resistance <100 ns, but unfortunately, no switching reversibility suggesting a WORM (Write Once Read-Only memory) applications.

TTF-CA (a charge transfer complex of tetrathiafulvalene and tetrachloro-p-benzoquinone) have been also studied for use as electrically bistable compound for memories applications (see, for example, Japanese Patent Laid-Open No. 345431/2001 on pages 2 and 3, FIG. 1). Finally, to complete the review on CT complexes, very recently Infineon Technologies claimed the discovering a new CT complex exhibiting excellent properties to be employed in non volatile memory devices [R. Sezi et al., 2003 IEEE International Electron Devices Meeting, Paper #10.2].

The molecular structure of the complex has not been revealed. Electrical experiments performed on the devices based on these materials have shown resistance ratio between the high and low conductivity states higher than 100.

The memory cells exhibited non-volatile data retention of more than 8 months. Moreover, the material, that shows a temperature stability of higher than 250° C., survived several thousand write/erase cycles under ambient conditions without degradation.

With regard to Organic Composite systems developed by UCLA University, the UCLA compounds are known from the following patent applications WO/0237500 and US 2004/027849.

Moreover it is known that, UCLA researchers invented a novel organic electrical bistable device (OBD) comprising of a thin metal layer embedded within the organic material, as the active medium [L. Ma et al., Appl. Phys. Lett., 2002, 80, 2997; L. Ma et al., Appl. Phys. Lett., 2003, 82, 1419]. The devices are non-volatile, featured by low transition time and precisely controlled by the application of a positive voltage pulse (to write) or a negative voltage pulse (to erase).

Such an approach includes the presence of complicated structures that involve the necessity to increase the production process steps, and the scalability of such an approach may present problems. Indeed, the scalability perspective for the composite developed by UCLA researchers is much less exciting respect to that related to organic material with single component that can be, in principle, scaled down till single molecule.

With regard to Simple Organic Molecules, their use is known from the following patents: CN No 1,239,329; CN No 1,344,719, CN No 1,333,571, CN No 1,352,470 and CN No 1,363,936.

Moreover there are few examples reported in the literature of this class of materials [.G. Li et al., Appl. Phys. Lett., 2000, 76, 2532; Z. Y. Hua et al., Appl. Surface SCIENCE, 2001, 169-170, 447].

The first paper [.J. G. Li et al., Appl. Phys. Lett., 2000, 76, 2532] concerns a device based on 1,1-dicyano-2,2-(4-dimethylaminophenyl)ethylene (DDME). High-quality DDME thin films were grown by a modified vacuum deposition [Z. Q. Xue et al., Thin Solid Film, 1996, 288, 296] and tested in a sandwiched device Au/DDME/Au (cell area 2.25 mm$^2$), fabricated on a Si substrate by usual vacuum deposition. The conductive state was stable at ambient atmosphere. Unfortunately, the switched regions resume the high resistance state when heated to 60° C. in vacuum for about 1 h, accompanied with the color return to brick-red. No reliability data are reported.

In the second paper [Z. Y. Hua et al., Appl. Surface SCIENCE, 2001, 169-170, 447] the molecular structures of 4-(2-pyridilazo)resorcinol, 1-(2-pyridilazo)-2-naphthol, glyoxal-bis-(2hydroxyanil) have been investigated. The resistivity of all these films can be transformed to 6-7 orders of magnitude (from ca. $10^{10}$ to $10^3$-$10^4$ Ωcm) and, once if the films are in low resistivity state they cannot return to high resistivity state the applied voltage is switched off. The threshold voltage across these organic films with a thickness of 60 nm is 4±6 V and the transition time is 5±10 ns. No reliability data are reported.

With regard the use of Polymers, D. Ma et al. report results on the electrical characteristics of switching devices constructed using a poly(methacrylate) derivative with pendant anthracene chromophores, poly(methylmethacrylate-co-9-anthracenyl-methylmethacrylate) (10:1) (MDCPAC) [D. Ma et al., Advanced Materials, 2000, 12, 1063]. It has been observed that the Au/MDCPAC/Al device has a switching time from the OFF state to the ON state that is shorter than 0.5 ms and can switch several thousand times. No reliability data are reported.

Amongst the above-mentioned classes of compounds, disodium salts of fluoresceine-based dyes, as for example (Bengal Rose, Eosyn Y, Fluoresceine disodiumsalt), DDQ (2,3-dichloro-5-6-dicyano-1,4-benzoquinone) and TAPA ((+)-2-(2,4,5,7-tetranitro-9-fluorenylideneaminooxy)propionic acid), are a very recent discover [A. Bandhopadhyay and A. J. Paj, Apl. Phys. Lett., 2003, 82, 1215-1217; A. Bandhopadhyay and A. J. Paj, J. Phys. Chem. B, 2003, 107, 2531-2536;].

Devices based on these molecules show electrical bistability with good retention time and cycles.

Correlation between switching devices based on different fluoresceine derivatives and interesting switching data storage properties is given in the Table here below.

| Molecule | ON/OFF Ratio | Retention | Cycles |
|---|---|---|---|
| Disodium Bengale Rose salt | $10^5$ | Tested for h | $>10^6$ |
| Disodium Eosin Y salt | 9800 | Tested for h | $>10^6$ |
| Disodium Fluorescein salt | 4 | Tested for h | $>10^6$ |
| DDQ | $10^4$ | Tested for h | $>10^6$ |
| TAPA | $10^4$ | 10 h | Not rewritable |

For this reasons these materials represent an interesting technological compounds for electronics applications.

Moreover, these disodium salts of fluoresceine-based dyes (Bengale Rose, Eosyn Y, Fluorescein), are low cost, easy to process and operating at low drive voltage, and therefore particularly suitable to be employed in memory devices.

Nevertheless, disodium salts of fluoresceine-based dyes have however some still unsolved drawbacks.

The main drawback lies in that when electrical stimuli are applied, disodium salts of fluoresceine-based dyes present ionic currents. From electrical point of view, this is a very negative effect given that causes various drawbacks such as transient bistable behaviors, decreasing of ON/OFF ratios, and films damage.

Recently, Anirban Bandyopadhyay et al. proposed to produce supramolecular structures of a fluoresceine derivate, namely the Rose Bengal, via layer by layer electrostatic self-assembly (ESA), see A. Bandhopadhyay and A. J. Paj Advanced Materials 2003, 15. No 22, Nov. 17, 1949-1952. ESA films of Rose Bengal in a conducting polymer matrix have been obtained, which are used as part of integrated circuit. In particular, three water-soluble polymers as cation (poly(allylamine hydrochloride), poly(diallyldimethylammonium chloride) and poly(p-xylene tetrahydrothiophenium chloride)) and Rose Bengal as anion have been used.

However, this solution is not free of inconveniences. For example, the use of polymers as cationic layer provides low ON/OFF ratios and unsatisfactory performances of the integrated circuit.

In view of the above-outlined drawback of the state of the art, one technical problem underlying embodiments of the present invention is that of providing electrically bistable fluoresceine derivatives, avoiding the presence of ionic currents that are responsible of electrical drawbacks such as transient bistable behaviors and decreasing of ON/OFF ratios.

SUMMARY OF THE INVENTION

Such a technical problem is solved, according to an embodiment of the invention, by the use of a fluoresceine derivative having the following formula:

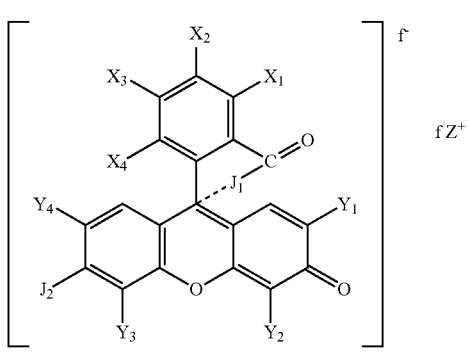

for the production of a electronic device, in particular a memory switch, wherein $X_1, X_2, X_3, X_4$ and $Y_1, Y_2, Y_3, Y_4$ are independently H, an electron withdrawing group, or an alkyl, aryl, aralkyl, alkenyl, or alkynyl group, or a heterocyclic group;

the dashed line represents a covalent bond or no bond;

$J_1$, is
O (oxygen), when the dashed line represents a covalent bond, and
a O—K group or O$^-$, when the dashed line represents no bond; and $J_2$ is independently an O—K group or O$^-$;

wherein K is independently H, an alkyl, aryl, aralkyl, alkenyl, or alkynyl group, a trialkyl-silyl group, a benzensulfonyl group, or a heterocyclic group;

and $Z^+$ is an organic cation;

provided that at least one of $J_1$ and $J_2$ is a O$^-$ and then f is 1 or 2, with the further proviso that the organic cation is different from a cationic polymer.

The electron withdrawing group is preferably selected from F, Cl, Br, I, CN, $NO_2$, COR, CHO, COOH, COOR, $CF_3$, COCl, $NH_3^+$, $NR_3^+$, RCONR, $NO_2$, $SO_2R$, SCN, $CCl_3$, $SO_3H$ or a thio-amidic group having the following formula: RCSNR.

Preferably, R is an alkyl, aryl, aralkyl, alkenyl, or alkynyl group or an heterocyclic group.

More preferably R is an aliphatic chain. More preferably R is a $C_1$-$C_{30}$ alkyl group.

The term heterocyclic group means a non-aromatic or aromatic monocyclic or polycyclic ring comprising carbon and hydrogen atoms and at least one heteroatom, preferably, 1 to 4 heteroatoms selected from nitrogen, oxygen, and sulfur.

According to a preferred embodiment, the heterocyclic group is a piperidine or a piperazine.

According to embodiments of the invention, a plurality of suitable organic cations can be used which ensure low cations mobility, avoiding the presence of ionic currents that are responsible of electrical drawbacks such as transient bistable behaviors, and decreasing of ON/OFF ratios.

For example, the organic cation is an alkyl ammonium cation, which is selected from the group of tetra-alkyl-ammonium having formula: $(R_1)_4N^+$; tri-alkyl-ammonium having formula: $(R_1)_3NH^+$, di-alkyl-ammonium having formula: $(R_1)_2NH_2^+$; alkyl-ammonium having formula: $R_1NH_3^+$, wherein $R_1$ is an alkyl group, preferably with 1 to 30 carbon atoms, such as a methyl group, ethyl group, n-propyl group and n-butyl.

According to a further embodiment of the invention, the organic cation is a sulfonate cation having the following formula $R_a$—$SO_2^+$, wherein $R_a$ is an alkyl group, preferably with 1 to 30 carbon atoms, such as a methyl group, ethyl group, n-propyl group and n-butyl, an aryl, aralkyl, alkenyl, or alkynyl group, or heterocyclic group.

Alternatively, the organic cation is a pyridinium cation or an alkyl, aryl, aralkyl, alkenyl, or alkynyl pyridinium cation having the following formula:

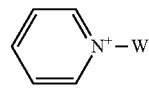

wherein W is H, alkyl, aryl, aralkyl, alkenyl, or alkynyl group, or a heterocyclic group, preferably a $C_1$-$C_{30}$ alkyl, in particular $CH_2CH_3$, or $C_6H_5$.

Alternatively, the organic cation is a bipyridinium cation or an alkyl, aryl, aralkyl, alkenyl, or alkynyl bipyridinium cation having formula:

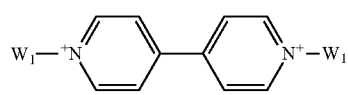

wherein $W_1$ is independently H, alkyl, aryl, aralkyl, alkenyl, or alkynyl preferably a $C_1$-$C_{30}$ alkyl, in particular $CH_2CH_3$, or $C_6H_5$, or a heterocyclic group.

Alternatively, the bipyridinium cation has the following formula:

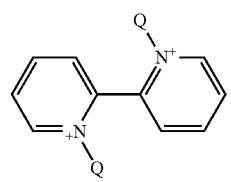

wherein Q is independently Cl, Br, F, I.

Alternatively, the organic cation is a pyrylium cation having the following formula:

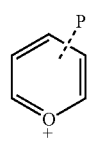

wherein P is H or an alkyl, aryl, aralkyl, alkenyl, or alkynyl group or a heterocyclic group. Preferably the pyrylium cation has one of the following formulas:

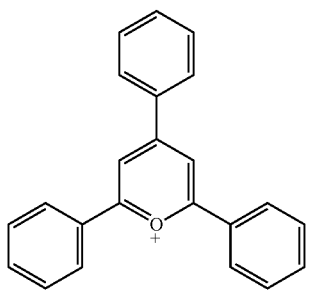
(5a)

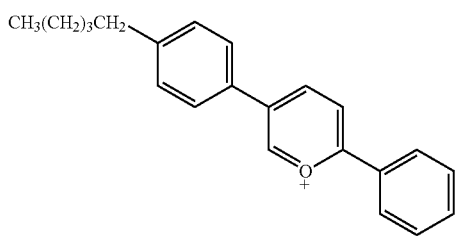
(6)

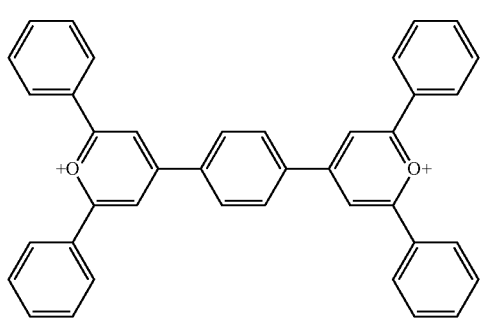
(7)

Alternatively, the organic cation is a thiopyrylium cation having the following formula:

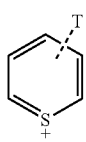
(8)

wherein T is H or an alkyl, aryl aralkyl, alkenyl, or alkynyl group or a heterocyclic group.

Preferably the thiopyrylium cation has the following formula:

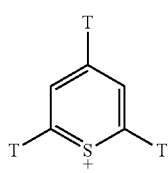
(8a)

wherein T is independently H or $C_1$-$C_{30}$ alkyl.

Alternatively, the organic cation is an alkyl, aryl, aralkyl, alkenyl, or alkynyl phosphonium cation, in particular having the following formula: $(R_2)_4P^+$ where $R_2$ is independently H, alkyl, aryl, aralkyl, alkenyl, or alkynyl group or a heterocyclic group provided that at least three $R_2$ are independently an alkyl, aryl, aralkyl, alkenyl, or alkynyl group or heterocyclic group, and preferably one of the following formulas:

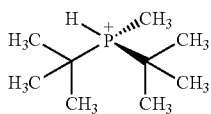
(9)

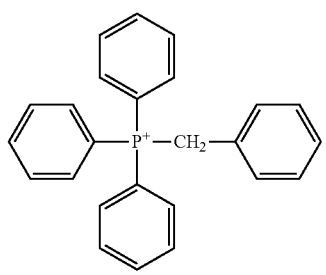
(10)

Alternatively, the organic cation is an alkyl, aryl, aralkyl, alkenyl, or alkynyl sulfonium cation, in particular $(R_3)_3S^+$ where $R_3$ is independently alkyl, aryl, aralkyl, alkenyl, or alkynyl group or a heterocyclic group and preferably one of the following formulas:

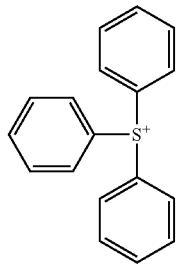
(11)

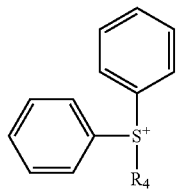
(12)

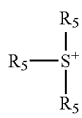
(13)

where $R_4$ is an aliphatic chain, preferably a $C_1$-$C_{30}$ alkyl and $R_5$ is an aliphatic chain, preferably a $C_1$-$C_{30}$ alkyl.

Alternatively, the organic cation is an alkyl, aryl, aralkyl, alkenyl, or alkynyl iodonium compound having the following formula: $(R_b)_2I^+$, wherein $R_b$ is independently alkyl, aryl, aralkyl, alkenyl, or alkynyl group, or an heterocyclic group.

Preferably the iodonium cation has one of the following formulas:

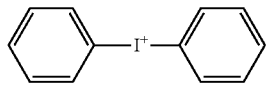
(14)

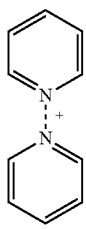
(15)

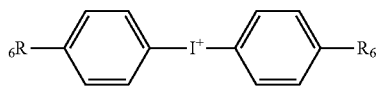
(16)

wherein $R_6$ is an aliphatic chain, preferably a $C_1$-$C_{30}$ alkyl.

Alternatively, the organic cation is a piperidine cation.

According to a first embodiment of the present invention, the fluoresceine derivative is a fluoresceine salt, wherein $X_1$, $X_2$, $X_3$, $X_4$ and $Y_1$, $Y_2$, $Y_3$, $Y_4$ are H and the dashed line represents no bond wherein both $J_1$ and $J_2$ are $O^-$ and $2Z^+$ are any one of the above-defined organic cations.

According to a second embodiment of the present invention the fluoresceine derivative is an eosine Y salt, wherein $X_1$, $X_2$, $X_3$, $X_4$ are H, $Y_1$, $Y_2$, $Y_3$, $Y_4$ are Br, and the dashed line represents no bond, wherein both $J_1$ and $J_2$ are $O^-$ and $2Z^+$ are any one of the above-defined organic cations.

According to a third embodiment of the present invention, the fluoresceine derivative is a phloxine salt, wherein $X_1$, $X_2$, $X_3$, $X_4$ are Cl, $Y_1$, $Y_2$, $Y_3$, $Y_4$ are Br and the dashed line represents no bond, wherein both $J_1$ and $J_2$ are $O^-$ and $2Z^+$ are any one of the above-defined organic cations.

According to a fourth embodiment of the present invention, the fluoresceine derivative is Bengale Rose salt, wherein $X_1$, $X_2$, $X_3$, $X_4$ are Cl, $Y_1$, $Y_2$, $Y_3$, $Y_4$ are I, and the dashed line represents no bond, wherein both $J_1$ and $J_2$ are $O^-$ and $2Z^+$ are any one of the above-defined organic cations.

The above defined fluoresceine derivatives are known and are generally produced by means of a salification step between an alkali or earth alkali salt of fluoresceine or a derivative thereof with a halide of an organic cation ($Z^+$).

For example the fluoresceine, wherein $X_1$, $X_2$, $X_3$, $X_4$ and $Y_1$, $Y_2$, $Y_3$, $Y_4$ are H, reacts in its alkali salt form with triethylammonium hydrochloride, for obtaining fluoresceine bis-triethylammonium.

According to a further example, eosine Y, wherein $X_1$, $X_2$, $X_3$, $X_4$ is H, $Y_1$, $Y_2$, $Y_3$, $Y_4$ are Br, reacts in its alkali salt form with triethylammonium hydrochloride for obtaining eosine Y bis-triethylammonium.

According to a further example, phloxine wherein $X_1$, $X_2$, $X_3$, $X_4$ are Cl, and $Y_1$, $Y_2$, $Y_3$, $Y_4$ are Br, reacts in its alkali salt form with triethylammonium hydrochloride for obtaining phloxine bis-triethylammonium.

An embodiment of the present invention also relates to a memory switch comprising a film made of one of the above-defined fluoresceine derivatives.

According to a preferred embodiment, the film is made of the above-defined fluoresceine salt wherein $X_1$, $X_2$, $X_3$, $X_4$ and $Y_1$, $Y_2$, $Y_3$, $Y_4$ are H, and both $2Z^+$ are triethylammonium.

According to a further preferred embodiment, the film is made of the above-defined eosine Y salt wherein $X_1$, $X_2$, $X_3$, $X_4$ are H, $Y_1$, $Y_2$, $Y_3$, $Y_4$ are Br, and both $2Z^+$ are triethylammonium.

According to further preferred embodiment, the film is made of the above-defined phloxine salt wherein $X_1$, $X_2$, $X_3$, $X_4$ are Cl, $Y_1$, $Y_2$, $Y_3$, $Y_4$ are Br and both $2Z^+$ are triethylammonium.

Alternatively, the film is made of the above-defined Bengale Rose salt, wherein $X_1$, $X_2$, $X_3$, $X_4$ are Cl, $Y_1$, $Y_2$, $Y_3$, $Y_4$ are I, and both $2Z^+$ are triethylammonium.

Preferably, the memory switch comprises two metal electrodes between which the film is sandwiched to form a laminate structure.

In a preferred embodiment of the present invention, the laminate structure comprises a substrate, and either the first electrode or the second electrode is stacked in contact with the top of the substrate.

Another embodiment of the present invention further relates to a memory device comprising the above-defined memory switch.

An embodiment of the present invention further relates to a method for producing a memory switch comprising two electrodes, wherein the method comprises the step of coating one of the electrodes with a film made of one of the above-defined electrically bistable fluoresceine derivatives.

Preferably, the coating step is obtained by means of a spinning step, wherein the fluoresceine derivative is spinned on the surface of electrode, preferably a bottom electrode, to form the film.

Alternatively, the coating step is performed by means of vacuum deposition of the fluoresceine derivate.

Further characteristics of the invention will be apparent from the following description of some embodiments thereof given by way of indicative and non limiting examples with reference to the annexed drawings.

DETAILED DESCRIPTION

Figure 1:
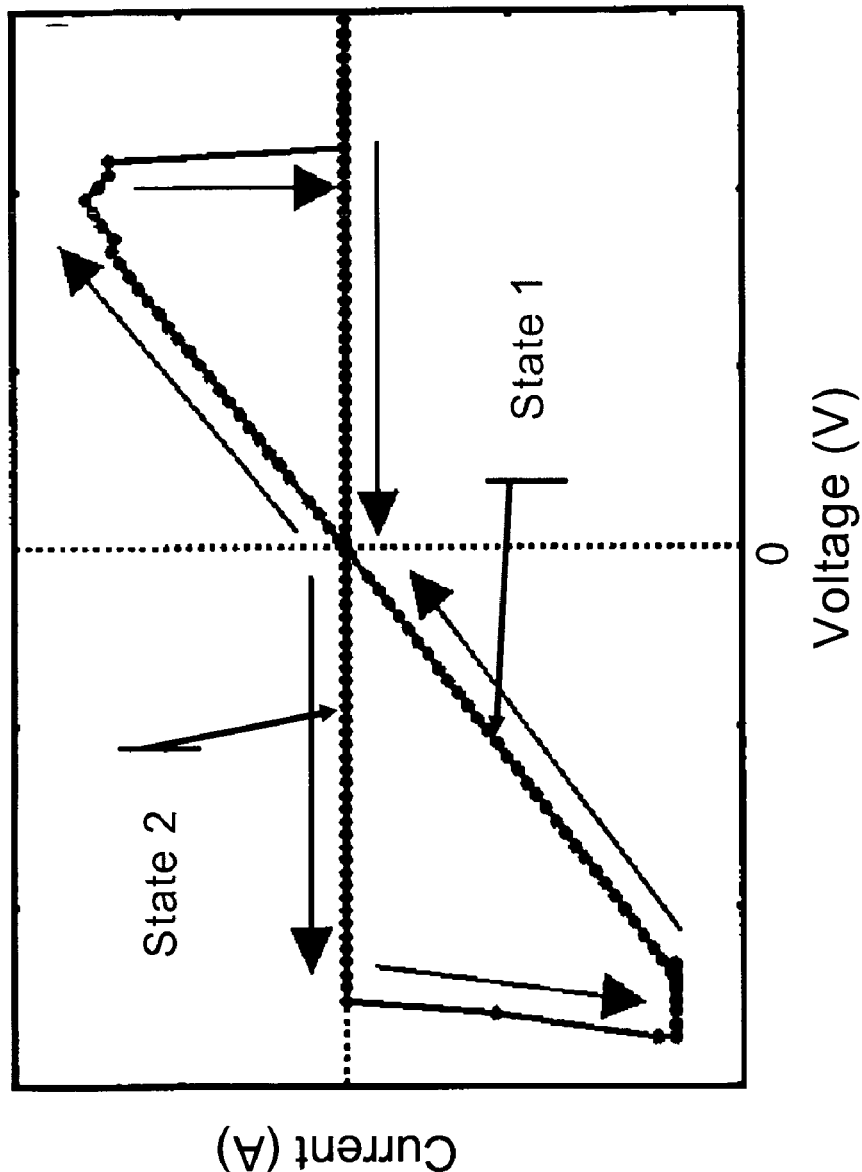
FIG. 1 one of the typical switching characteristics of organic electrically bistable materials according to the prior art.

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

At first with reference to the following examples it will be described the preparation of electrically bistable fluoresceine derivatives according to embodiments of the invention.

In particular, the following fluoresceine derivatives have been prepared:

fluoresceine salt wherein the organic salt is triethyl-ammonium (TEA);

eosyne Y salt wherein the organic salt is triethyl-ammonium (TEA);

phloxine salt wherein the organic salt is triethyl-ammonium (TEA); and

Bengale Rose salt wherein the organic salt is triethyl-ammonium (TEA).

The preparation of the above reported salts has been carried out as follows:

Synthesis of Triethylammonium Salt (TEA)

10 ml of triethylamine (0.072 mol) was dropped, in ice bath, in 9 ml di HCl 12 M (0.109 mol) and stirred for 3 hs (Scheme 1). The solvent was taken off under reduced pressure and the obtained white solid was washed several times with methanol and dichloromethane and dried under vacuum.

$(CH_3—CH_2)_3N+HCl \rightarrow (CH_3—CH_2)_3NH^+Cl^-$

Scheme 1 Synthesis of TEA

Molecular Characterization

The molecular characterization of TEA was carried out by Mass Spectrometry (MS) and FTIR analyses.

MS analysis. Mass spectrum of TEA was carried out in methanol solution and the following diagnostic peaks are present: $[TEA]^+$ 101.9 m/z (100%) 102.9 m/z (10%).

FTIR analysis. Infrared spectrum, obtained on solid state, exhibits the peaks diagnostic of TEA: C—H stretch. 2969 $cm^{-1}$, $CH_3$ strech. 2931, 2873 $cm^{-1}$; N—H strech.-2600 2498 $cm^{-1}$; C—H bend. 1479, 1390 $cm^{-1}$; C—N stretch. 1030 $cm^{-1}$.

Synthesis of Fluorosceine Bis-Triethylammonium Salt (Fl-TEA)

Disodium Fluoresceine (Fl) (0.40 gr, 1.06 mmoli) and triethylammonium chloride (TEA) (0.3 gr, 2.2 mmoli) suspended in dichloromethane were stirred at room temperature in darkness for 3 h.

The following scheme 2 clearly illustrates the synthesis process (salification) of fluorosceine bis-triethylammonium salt.

The suspension was filtered by PTFE filter (0.2 μm) and the filtrate was dried and fully characterized.

Fluorosceine bis-triethylammonium salt is thus obtained.

Molecular Characterization

The molecular characterization of Fl-TEA was carried out by Mass Spectrometry (MS), Nuclear Magnetic Resonance (NMR) and FTIR Infrared Spectroscopy analyses.

MS analysis. Mass spectrum of Fl-TEA in methanol solution exhibits the following diagnostic peaks: $[Fl]^{--}$ 165.4 $m/z^2$ e $[Fl^{---}-TEA^+]^-$ 431.3 m/z.

NMR analysis. $^1$H-NMR spectrum in $CD_2Cl_2$ (200 MHz) shows the following diagnostic peaks: δ 1.1 (18H, t, J=7.4 Hz, ethyl $CH_3—CH_2—$); 2.77 (12H, q, ethyl $CH_3—CH_2$); 6.46 (1H d, J=2.2 Hz, xanthene-H), 6.5 (1H d, J=2.0 Hz, xanthene-H), 6.57 (2H d, J=2.2 Hz, xanthene-H), 6.85 (1H s, xanthene-H), 6.89 (1H s, xanthene-H); 7.17 (1H m $J_{orto}$=5.5 Hz, $J_{meta}$=3.0 Hz, benzene-H), 7.58 (2H m, $J_{orto}$=5.7 Hz, $J_{meta}$=2.9 Hz, benzene-H); 8.07 (1H m, $J_{orto}$=5.8 Hz, $J_{meta}$=2.8 Hz, benzene-H).

FTIR analysis. Infrared spectrum of Fl-TEA carried out in solid state exhibits the following characteristic peaks of triethylammonium: C—H strech. 2987 $cm^{-1}$; N—H strech.-2610-2491 $cm^{-1}$. Furthermore the typical fingerprint of fluoroscein-dyes are present (1627 $cm^{-1}$, 1561 $cm^{-1}$, 1450 $cm^{-1}$, 1318 $cm^{-1}$, 1222 $cm^{-1}$, 970 $cm^{-1}$) that confirms the molecular structure of Fl-TEA.

The measured melting point (BÜCHI B-545 instrument) of Fl-TEA is 100-103° C.

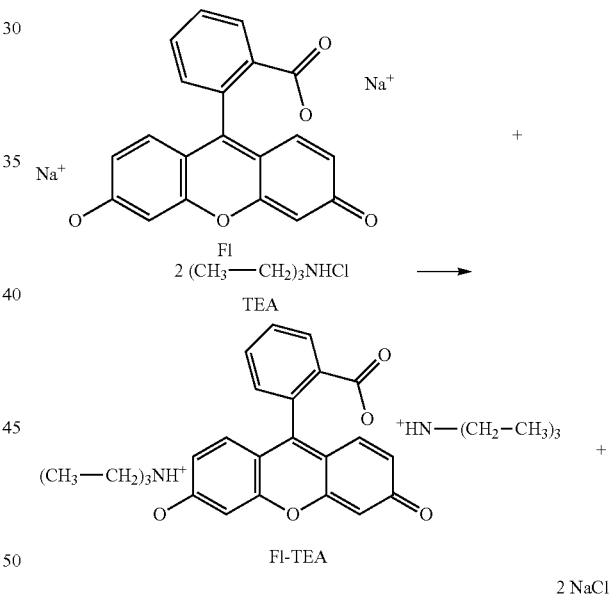

Scheme 2

Synthesis of Eosyne Y Bis-Triethylammonium Salt (Ey-TEA)

Disodium Eosyne Y (Ey) (0.42 gr) and triethylammonium chloride (TEA) (0.2 gr) suspended in dichloromethane were stirred at room temperature in darkness for 3 h. The suspension was filtered by PTFE filter (0.2 μm) and the filtrate was dried and fully characterized.

Eosyne Y bis-triethylammonium salt is thus obtained.

The following scheme 3 clearly illustrates the synthesis process of eosyne Y bis-triethylammonium salt.

Molecular Characterization

The molecular characterization of Ey-TEA was carried out by Mass Spectrometry (MS), Nuclear Magnetic Resonance (NMR) and FTIR Infrared Spectroscopy analyses.

MS analysis. Mass spectrum (ESI-MS) of Ey-TEA was carried out in methanol solution and show the follows diagnostic peaks: [Ey]$^-$ 485.7 m/z$^2$, [Ey$^{--}$-TEA]$^-$ 1072.9 m/z.

NMR analysis. $^1$H-NMR spectrum in CD$_2$Cl$_2$ (200 MHz) exhibits the following diagnostic peaks: δ 1.22 (18H, t, J=7.2 Hz, ethyl CH$_3$—CH$_2$—); 2.94 (12H, q, ethyl CH$_3$—CH$_2$); 7.28 (2H s, xanthene-H); 7.14 (1H m, J$_{orto}$=6.0 Hz, benzene-H), 7.55 (2H m, benzene-H); 8.14 (1H m, J$_{orto}$=6.9 Hz, benzene-H).

FTIR analysis. Infrared spectrum of Ey-TEA was carried out in solid state and shows the following characteristic peaks of triethyl ammonium: C—H strech. 2969 cm$^{-1}$; N—H strech.-26132-2498 cm$^{-1}$. Furthermore the typical fingerprint of fluoroscein-dyes are present (1627 C=O 1740 cm$^{-1}$) that confirms the molecular structure of Ey-TEA.

The measured melting point (BÜCHI B-545 instrument) of Ey-TEA is 125-130° C.

NMR analysis. $^1$H-NMR spectrum in CD$_2$Cl$_2$ (200 MHz) exhibits the following diagnostic peaks: δ 1.22 (18H, t, J=7.2 Hz, ethyl CH$_3$—CH$_2$—); 2.96 (12H, q, ethyl CH$_3$—CH$_2$); 7.29 (2H s, xanthene-H).

FTIR analysis. Infrared spectrum of PH-TEA carried out in solids state shows the presence of the following characteristic peaks of triethylammonium: C—H strech. 2982 cm$^{-1}$; N—H strech.-2622-2501 cm$^{-1}$. Furthermore the typical fingerprint of fluoroscein-dyes are present (1627 cm$^{-1}$, 1561 cm$^{-1}$, 1450 cm$^{-1}$, 1318 cm$^{-1}$, 1222 cm$^{-1}$, 970 cm$^{-1}$) that confirms the molecular structure of PH-TEA.

The measured melting point (BÜCHI B-545 instrument) of PH-TEA is 145-150° C.

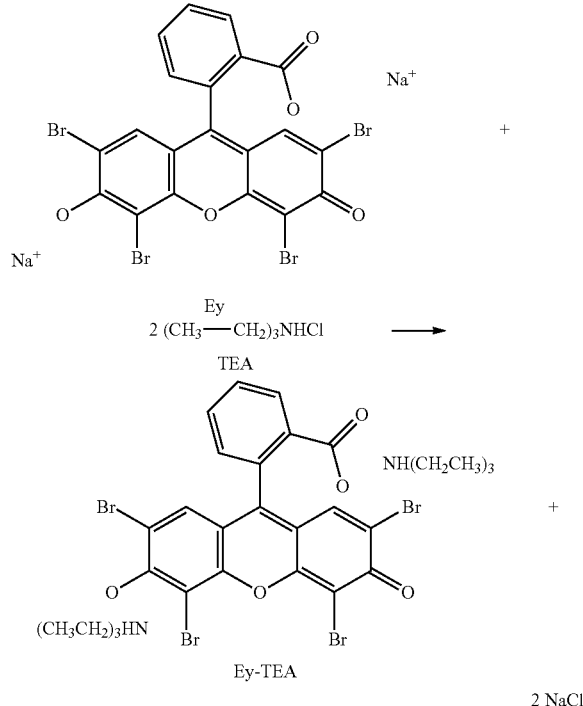

Scheme 3

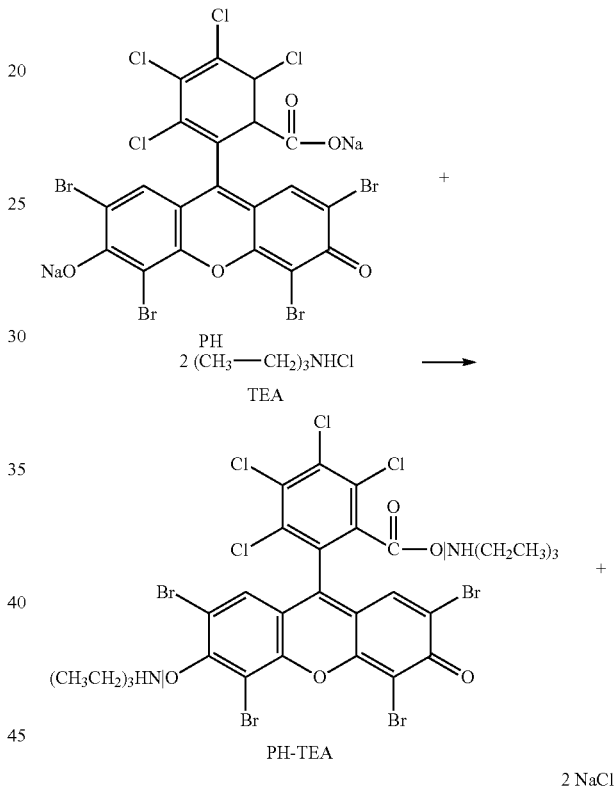

Scheme 4

Synthesis of Phloxine Bis-Triethylammonium Salt PH-TEA

Disodium Phloxine-B (PH) (0.32 gr, 3.8×10$^{-4}$ moli) and triethylammonium chloride (TEA) (0.2 gr, 1.5×10$^{-3}$ moli) suspended in dichloromethane were stirred at room temperature in darkness for 3 h. The suspension was filtered by PTFE filter (0.2 μm) and the filtrate was dried and fully characterized.

Phloxine bis-triethylammonium salt is thus obtained.

The following scheme 4 clearly illustrates the synthesis process of phloxine bis-triethylammonium salt.

Molecular Characterization

The molecular characterization of PH-TEA was carried out by Mass Spectrometry (MS), Nuclear Magnetic Resonance (NMR) and FTIR Infrared Spectroscopy analyses.

MS analysis. Mass spectrum of PH-TEA in methanol solution shows the following diagnostic peaks: [PH]$^{--}$ 391.3 m/z$^2$, [PH$^{--}$-TEA$^+$]$^-$ 885.56 m/z.

Synthesis of Bengale Rose Bis-Triethylammonium Salt (BR-TEA)

Disodium Rose Bengale (BR) (0.32 gr, 3.8×10$^{-4}$ moli) and triethylammonium chloride (TEA) (0.2 gr, 1.5×10$^{-3}$ moli) suspended in dichloromethane were stirred at room temperature in darkness for 3 h. The suspension was filtered by PTFE filter (0.2 μm) and the filtrate was dried and fully characterized.

Bengale Rose bis-triethylammonium salt is thus obtained.

The following scheme 5 clearly illustrates the synthesis process of bengale rose bis-triethylammonium salt.

Molecular Characterization

The molecular characterization of BR-TEA was carried out by Mass Spectrometry (MS), Nuclear Magnetic Resonance (NMR) and FTIR Infrared Spectroscopy analyses MS analysis. Mass spectrum of BR-TEA in methanol solution shows the following diagnostic peaks: [BR]$^{--}$ 971 m/z$^2$, [BR$^{--}$-TEA$^+$]$^-$ 1073. m/z.

NMR analysis. $^1$H-NMR spectrum in CD$_2$Cl$_2$ (200 MHz) exhibits the following diagnostic peaks: δ 1.22 (18H, t, J=7.2 Hz, ethyl CH$_3$—CH$_2$—); 2.96 (12H, q, ethyl CH$_3$—CH$_2$); 7.52 (2H s, xanthene-H).

FTIR analysis. Infrared spectrum of BR-TEA carried out in solids state shows the presence of the following characteristic peaks of triethylammonium: C—H strech. 2982 cm$^{-1}$; N—H strech.-2622-2501 cm$^{-1}$. Furthermore the typical fingerprint of fluoroscein-dyes are present (1627 cm$^{-1}$, 1561 cm$^{-1}$, 1450 cm$^{-1}$, 1318 cm$^{-1}$, 1222 cm$^{-1}$, 970 cm$^{-1}$) that confirms the molecular structure of PH-TEA.

The measured melting point (BÜCHI B-545 instrument) of BR-TEA is 185° C.

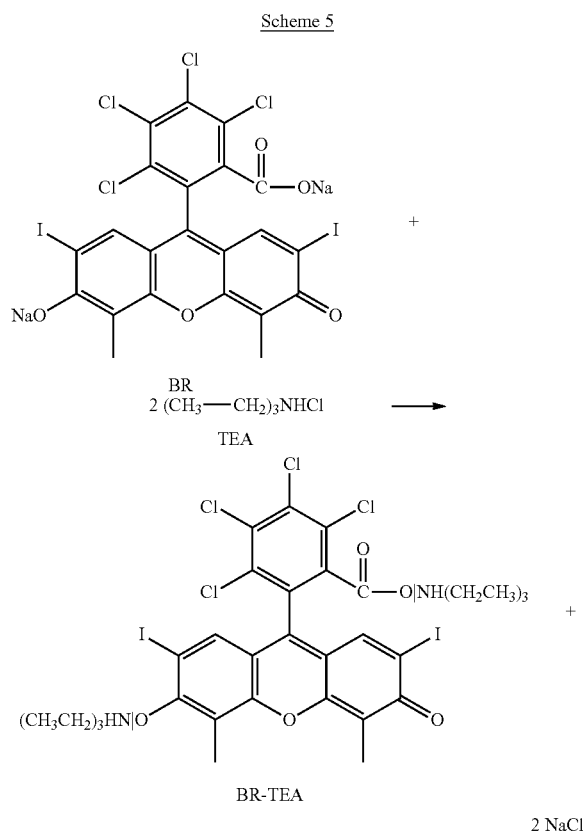

Scheme 5

Organic Bistable Memory Switch

Figure 2:
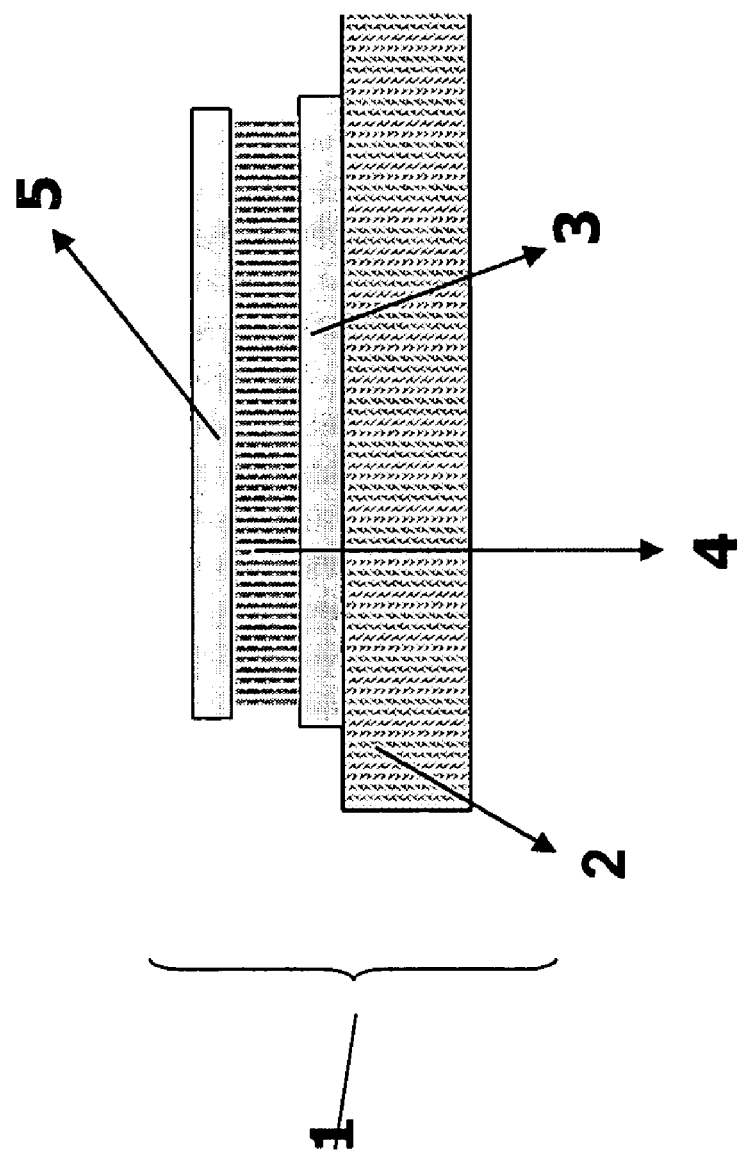
FIG. 2 is a schematic cross-sectional view of a basic laminate structure of the organic bistable memory switch according to an embodiment of the present invention.

With reference to FIG. 2, an organic bistable memory switch 1 according to an embodiment of the invention is now disclosed.

The organic bistable memory switch 1 comprises a organic thin film 4 formed of one of the above-mentioned fluoresceine derivatives having a organic cation as countercation.

More in details, in the illustrated solution, the organic film 4 is made of one of the salts, which have been synthesized according to the above processes:

fluoresceine salt wherein the organic salt is triethyl-ammonium (TEA);
eosyne Y salt wherein the organic salt is the organic salt is triethyl-ammonium (TEA);
phloxine salt wherein the organic salt is triethyl-ammonium (TEA); and
Bengale Rose salt wherein the organic salt is triethyl-ammonium (TEA).

The memory switch 1 further comprises, a first electrode 3 and a second electrode 5, between which the organic film 4 is sandwiched.

The memory switch 1 further comprises electric signal impressing means (not illustrated in FIG. 2) for impressing an electric signal between the first electrode 3 and the second electrode 5.

In more detail, the memory switch 1 according to embodiments of the present invention has a laminate structure in which a first electrode 3, the organic thin film 4, and a second electrode 5 are stacked in that order on a substrate 2. More specifically, the first electrode 3, the organic thin film 4, and the second electrode 5 are stacked on the substrate 2 in that order.

It is to be noticed that, the main function of the substrate 2 is that of supporting the electrodes 3 and 5, and the film 4 provided thereon.

The substrate 2 is formed of an inorganic base material such as glass, silicon, or quartz or the following organic base material.

It is also to be noted that, thanks to the presence of the substrate 2, the manoeuvrability of the organic bistable memory switch is improved due to the rigidity imparted by the substrate 2 to the organic bistable device.

Further, the provision of the substrate facilitates the arrangement of a large number of the elements on the substrate to form a memory device or the like.

In addition, according to a further embodiment, the substrate 2 is formed of an organic base material.

Organic base materials usable herein include polyamides, polyacetals, polybutylene terephthalate, polyethylene terephthalate, polyethylene naphthalate, syndiotactic polystyrene, polyphenylene sulfide, polyetherether ketone, liquid crystal polymers, fluororesins, polyether nitrile, polycarbonate, modified polyphenylene ether, polycyclohexene, polynorbornene resins, polysulfone, polyether sulfone, polyarylate, polyamideimide, polyetherimide, and thermoplastic polyimides. The organic base material, however, is not limited to these materials, and conventional plastics may also be used.

In particular, when the substrate 2 is formed of an organic base material, the use of a thin flexible film having a thickness of about 5 to 300 [mu]m can provide a flexible organic bistable device.

The first electrode 3 is preferably formed of, for example, a metallic thin film, a relatively high electrically conductive organic thin film, or a thin film of electrically conductive perovskite oxide from the viewpoint of providing proper bonding to the organic thin film 4 as a bistable layer. The metallic thin film may be formed of, for example, a highly electrically conductive metal such as Al (aluminum), Pt (platinum), Au (gold), Ag (silver), Fe (iron), Ni (nickel), Cr (chromium), Cu (copper), Ti (titanium), Hf (hafnium), Zn (zinc), Zr (zirconium), Mo (molybdenum), or Ta (tantalum).

The highly electrically conductive organic thin film may be formed of, for example, PEDOT (3,4-polyethylenedioxythiophenylene/polystyrene sulfate), or properly doped polyaniline, polyacethylene, fullerene, carbon nanotube or carbon nanowire.

The electrode may also be formed of a thin film of electrically conductive perovskite oxide. Suitable electrically conductive perovskite oxides include IrOx, MnOx, NiOx, CuOx, or RuOx or properly doped product of the above oxides. The thickness of the first electrode 3 is preferably about 0.5 nm to 5 [mu]m although the thickness varies depending upon the electrical conductivity of the material.

As with the first electrode 3, the second electrode 5 is formed of a metallic thin film, a relatively high electrically conductive organic thin film, a thin film of an electrically conductive perovskite oxide or the like.

The thickness of the second electrode 5 may be the same as that of the first electrode 3.

The memory switch according to an embodiment of the invention, may be obtained according to the following method.

In a first step, so called coating step, the organic thin film 4 is deposited on the first electrode 3, which is the bottom electrode.

More in particular, the coating step is performed by means of a spin technique. It consists of preparing a solution of the above fluoresceine salt having a organic countercation in a suitable solvent, as for example methanol, or dichloromethane, to obtain a fluoresceine solution of about 0.1M concentration.

The electrode 3 is introduced in a spin apparatus and placed on a suitable rotating substrate.

The solution is deposited on the electrode 3, and this latter is rotated at 3000-5000 rpm for 90 sec until the complete evaporation of the solvent.

An example of a suitable spin apparatus is the Spin coating system Model 6712D from Speciality Coating System provided by Cookson Electronics Company.

According to a further embodiment, the coating step is performed by means of a gas phase technique, such as a vacuum deposition step.

In this case, the fluoresceine derivative is deposited on the electrode 3, for example by means of a Evaporator System which is provided by Elettro Rava S.p.A. Torino.

This system comprises a deposition chamber having a source made of the target material to be deposited, i.e. the fluoresceine derivative.

The chamber is kept under Vacuum (10-8 Torr) and the source is heated at a temperature of 75° C.

Under these conditions a rate deposition of 0.3 A°/sec is obtained

The thickness of the organic thin film 4 is suitably 5 to 1000 nm.

The organic bistable memory switch thus obtained is suitable for use in a memory device.

In particular, when the organic bistable memory switch is used as a memory, whether the organic bistable memory switch 1 is in ON state or in OFF state can be judged by applying a positive or negative pulse voltage to the organic bistable element for a very short period of time to bring the state to writing (ON state) or erasing (OFF state) and then applying a constant voltage, which is a voltage smaller than the absolute value of the pulse voltage for writing or erasing, for a very short period of time. The characteristics of the memory switch can be examined by applying a positive or negative voltage across the first electrode 3 and the second electrode 5 to measure current which flows across both the electrodes, or allowing a positive or negative current to flow across both the electrodes to measure voltage across both the electrodes 3, 5.

As described above, the organic bistable element according to embodiments of the present invention is usable, by utilizing its characteristics, for an organic bistable memory device, which can electrically write, read, and erase information, and for other applications.

In this context, an array of memory switches according to an embodiment of the present invention can be arranged in a cross-bar architecture where each memory switch can be combined with either a diode sandwiched below the memory switch, to prevent possible malfunction such as cross-talk, or a transistor (MOSFET, TFT) sandwiched below the memory switch to allow fast access times.

Example of BR-TEA Bistable Memory Switch 1

An organic bistable memory switch shown in FIG. 2 was prepared according to the following procedure.

Figure 3:
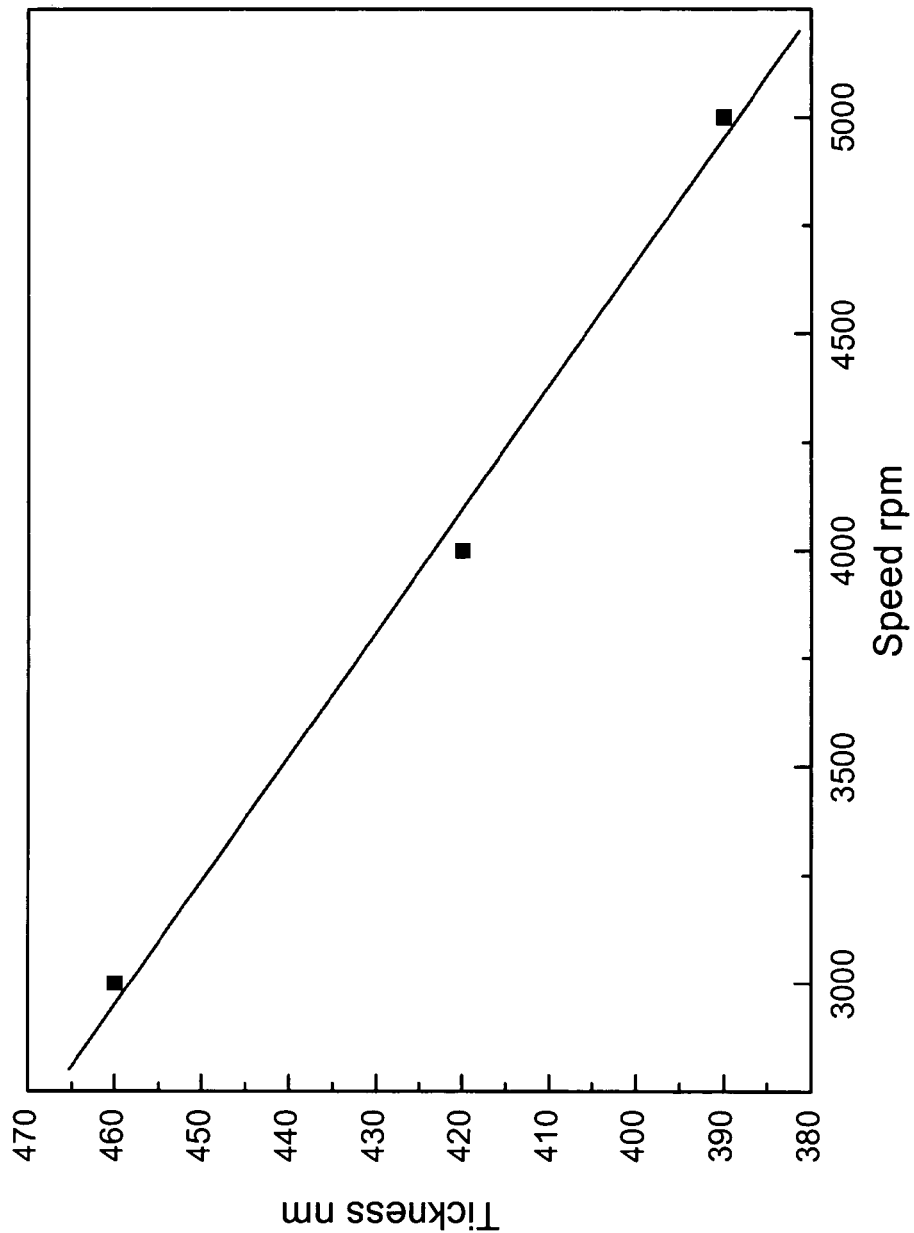
FIG. 3 is curve that reports Bengale Rose-bis triethylammonium (BR-TEA) films thickness vs spin rotation rate.

ITO covered glasses substrates (1 cm×2 cm) have been first sonicated for 300 s in a 2-H propanol bath and then dried in an oven at 80° C. for 30 min. Methanol solutions of BR-TEA 0.1M have been deposed by spin coating on such substrates (bottom electrode) by using a Spin coating system Model 6712D from Speciality Coating System (Cookson Electronics Company) with several rotation rates (3000-5000 rpm) for 90 sec. FIG. 3 shows the correlation between the films thickness obtained and the spin rotation rates.

To improve the films homogeneity some samples have been annealed at 80° C. for 8 hours under vacuum.

The gold top electrodes (60-80 nm thick) have been deposed on the organic films by means of Emitech K650X Sputtering Coater operating under argon atmosphere with 20-75 mA for 4 minutes. A shadow-mask has been employed obtaining bistable memory switch of size 1.5×1.0 mm.

Figure 4A:
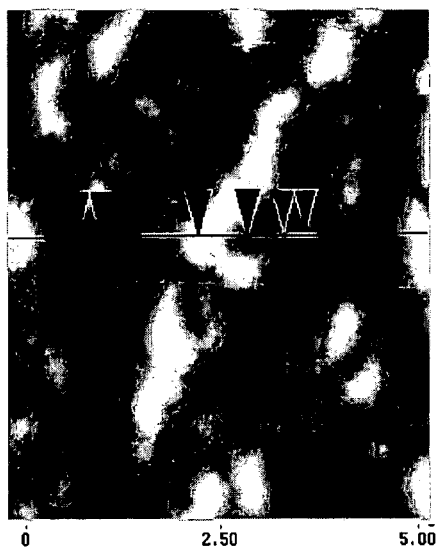
FIGS. 4a and 4b are Atomic Force Microscopy (AFM) images showing morphology of BR-TEA films (5×5 micron) before and after the annealing processes respectively.
Figure 4A:
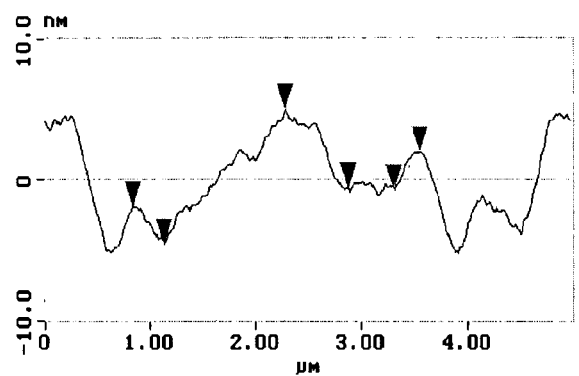
Figure 4B:
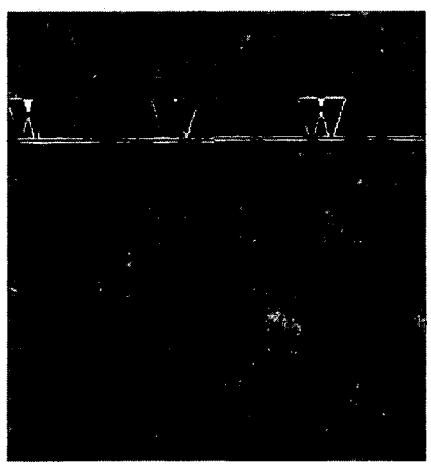
Figure 4B:
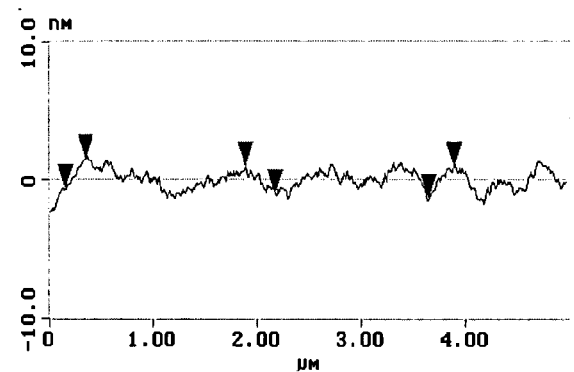

The morphology of BR-TEA films has been inspected by AFM. FIGS. 4a and 4b reports the section analysis of BR-TEA films, deposed by using spin rate of 4000 rpm for 90 sec, before (FIG. 4a) and after (FIG. 4b) the annealing processes. The AFM measurements show that the annealing treatment provokes an increase of flattening of the films. Indeed, the related RMS (Root Mean Square) values decrease from 2.5 for the not annealed films to 1.0 nm for the annealed ones.

Figure 5:
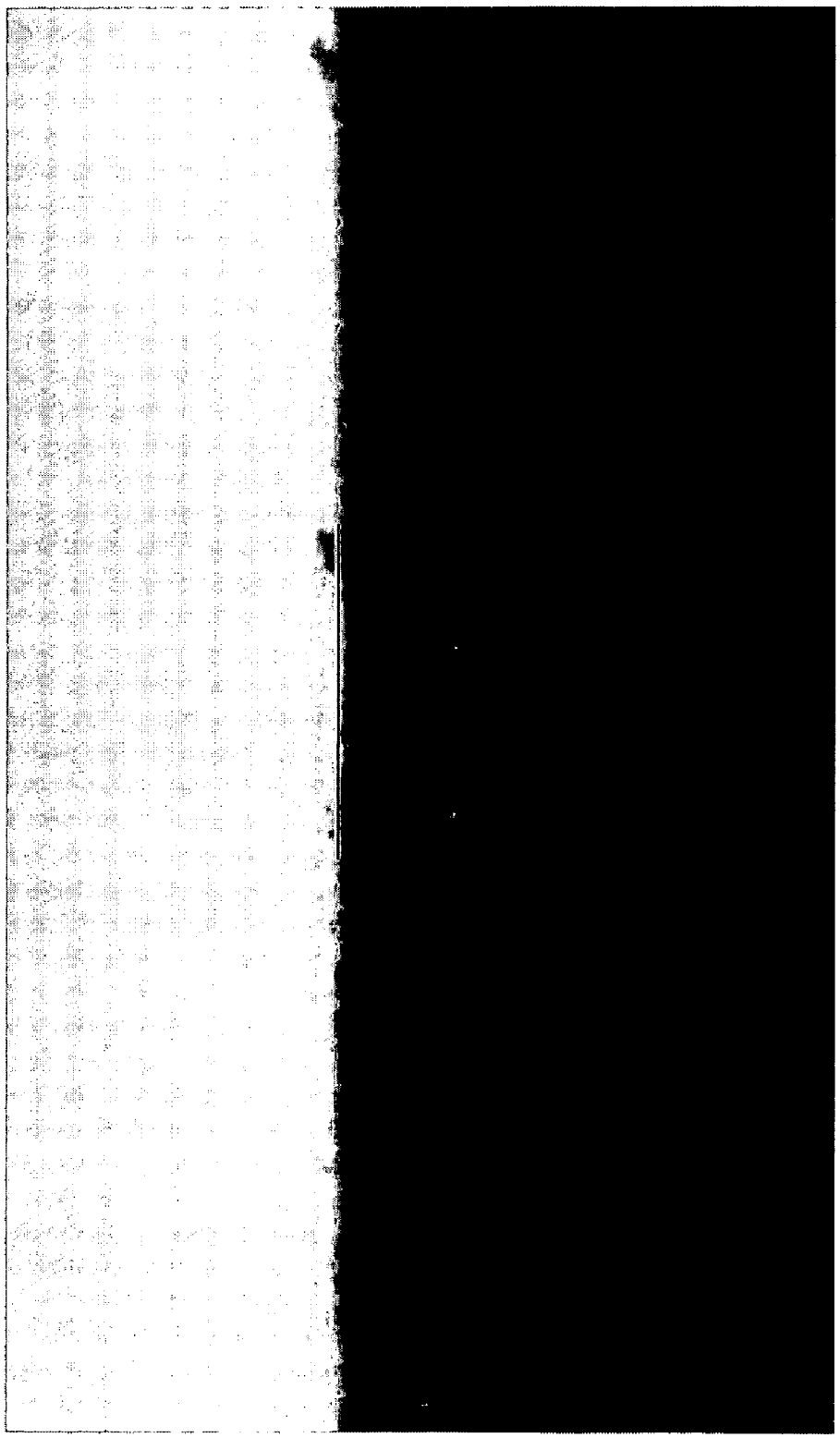
FIG. 5 illustrates the Scanning Electron Spettroscopy (SEM) section view of BR-TEA films on silicon substrate (4000 rpm, 90 sec.)

FIG. 5 reports the SEM section view of the above reported not annealed BR-TEA films deposed on the silicon substrate. A film thickness of 420 nm is observed.

Electrical characterization has been performed on BR-TEA based memory switch prepared by spinning the organic film at 4000 rpm and annealing it as above described. The experimental condition and set up have been: room temperature, in air, of Agilent 4155C semiconductor parameter analyzer, used in:
  sweep mode to measure the device characteristics;
  sampling mode to measure the device resistance and the device retention;
and Hp81110A pulse generator used to set/reset the status.

Figure 6:
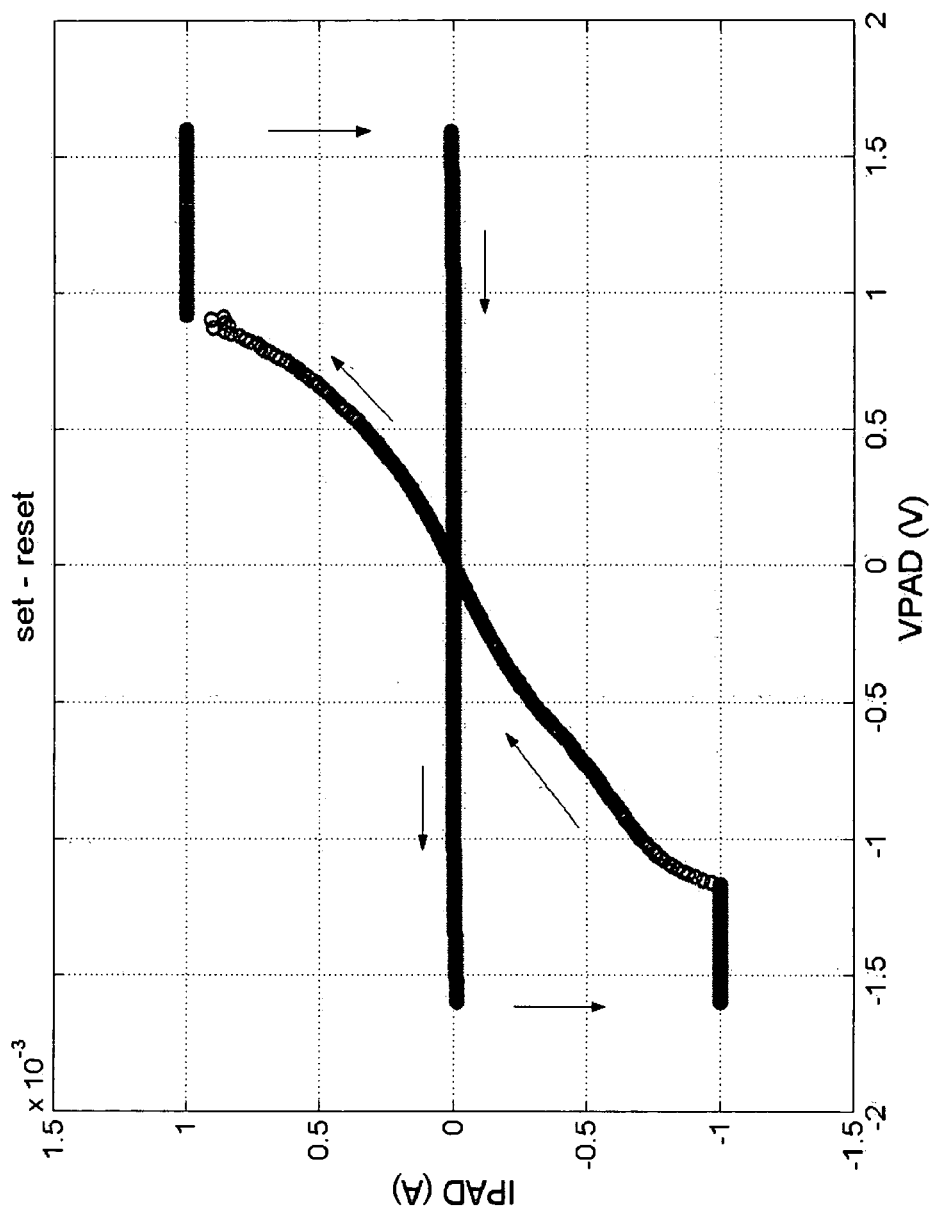
FIG. 6 illustrates the double sweep characterization of BR-TEA based memory switches.
Figure 7:
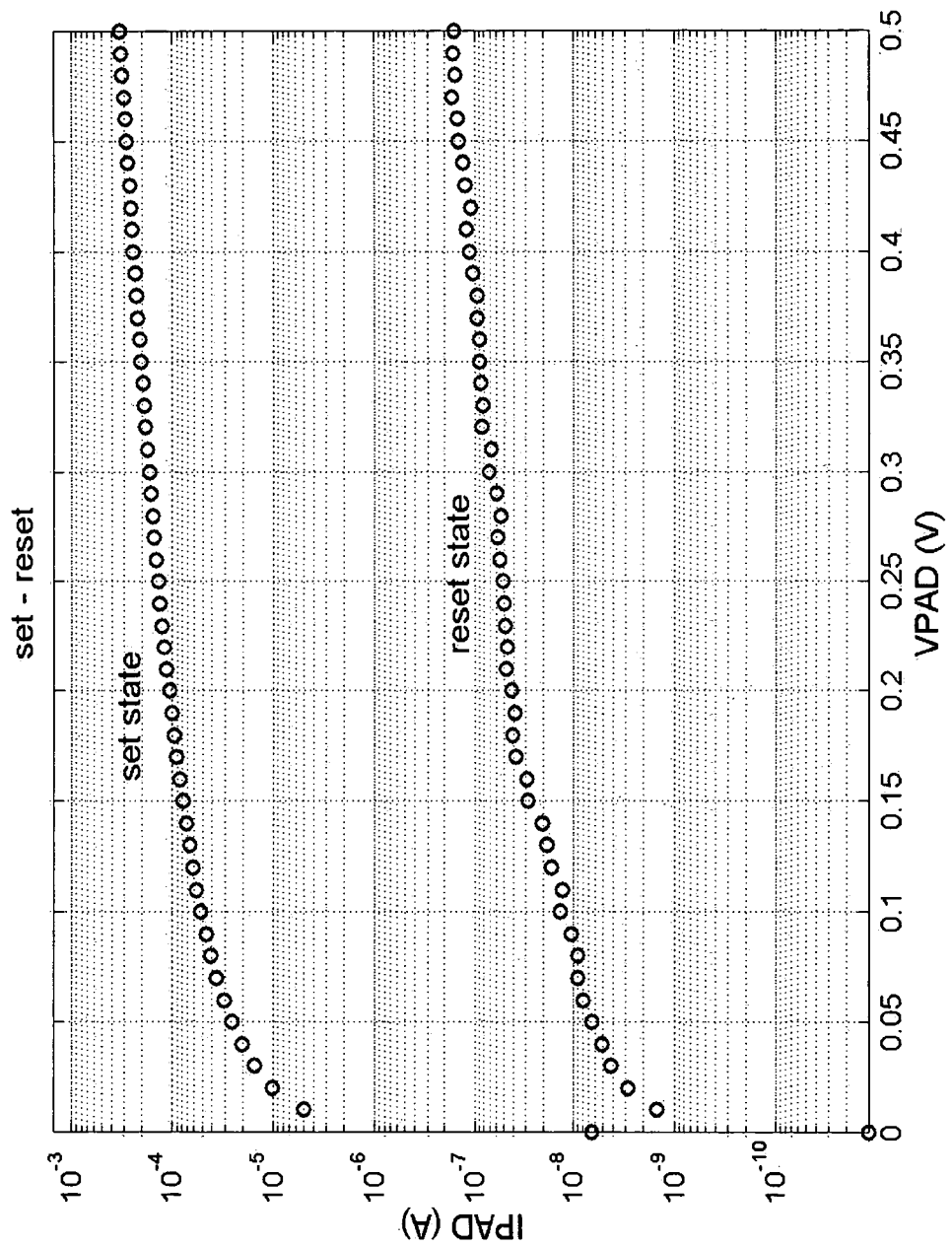
FIG. 7 is an enlarged view of the achieved set and reset states for BR-TEA based memory switches.

FIG. 6 and FIG. 7 show the I-V characteristic of the BR-TEA based memory switch. A bistable characteristic has been observed with a ON/OFF windows up to 3 order of magnitude, as reported in the enlarged view on the right of FIG. 7.

Figure 8:
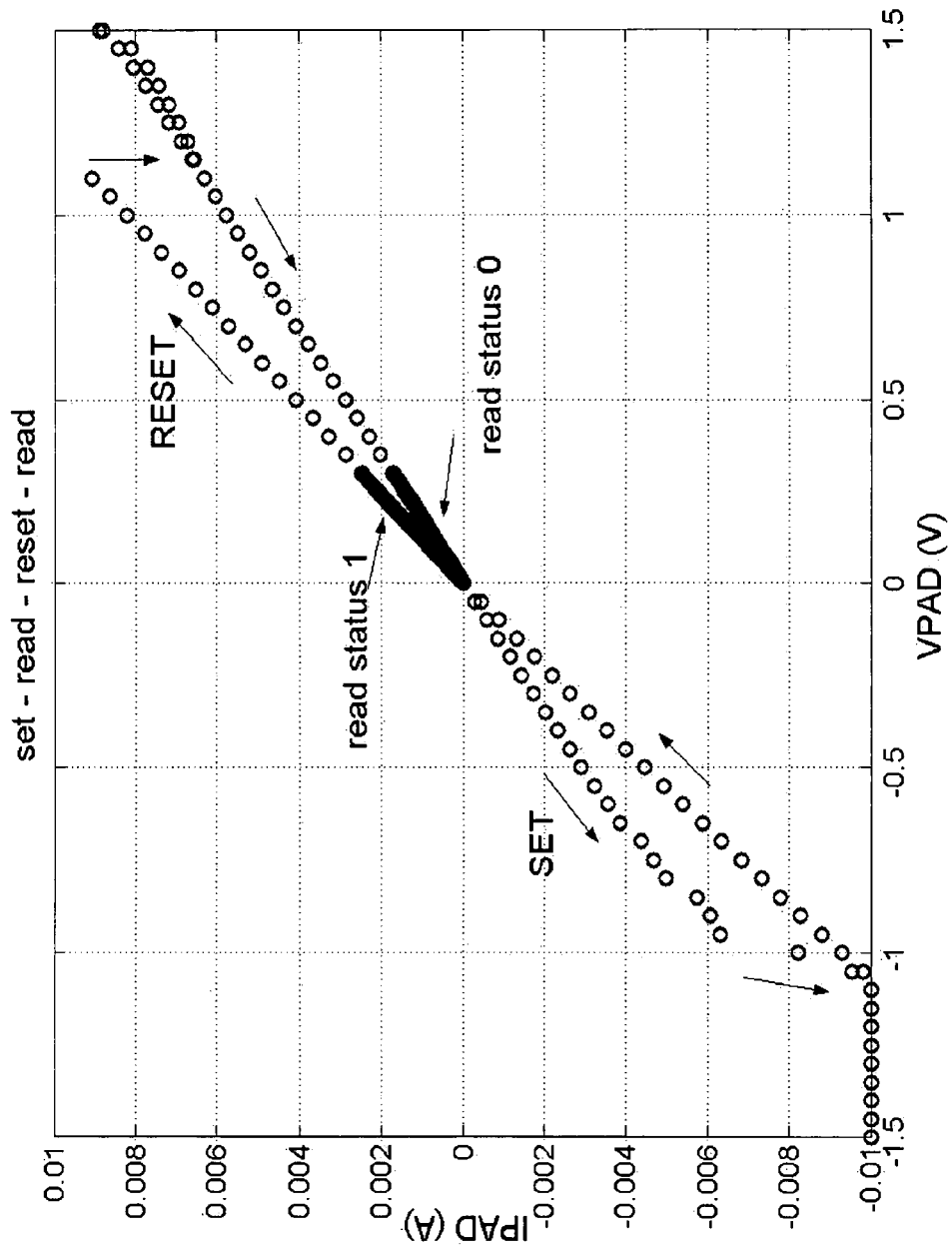
FIG. 8 illustrates the current-voltage (I-V) characteristic showing hysteresis and reading sweeps superimposed on it of BR-TEA based memory switches.

For these devices, the required programming voltages are in the range 1-2 V (negative to program (Set) and positive to erase (Reset)). By convention it has been defined the following states in which the memory is set:
  Set status: low resistance
  Reset status: high resistance
  To check the cycling memory behavior, the following measurements have been performed:
  Memory set (programming, that is transition from high resistance to low resistance), this has been obtained by applying a programming pulse of 1-2 V amplitude, 1 ms-10 ms duration
  Read memory set status: current is measured at low voltage, in order not to disturb the system (either −100 mV or 100 mV);
  Memory reset (from low resistance to high resistance): this has been obtained by applying an erasing pulse of −1--2 V amplitude, 1 ms-10 ms duration
  Read reset status: same measurement as set status
  Cycling behavior has been also observed on these based memory switches. A reproducible bi-stable characteristic has been measured for tenths of cycles with 1 ms programming/erasing pulses, with ±1.5 V amplitude. FIG. 8 shows an example of cycle: after the initial characterization, different set pulses and reset pulses have been applied, reading the status after each step. The reading characteristics, performed at low voltage, are perfectly superimposed to the initial characteristic, either low resistance or high resistance, thus proving the intrinsic good switching/cycling behavior of these devices.

Memory retention has been measured as follows:
1. Memory is set;
2. Memory status is read every 5 s at room temperature for 1000 s
3. Memory is reset;
4. Memory status read every 5 s at room temperature for 1000 s.

Figure 9:
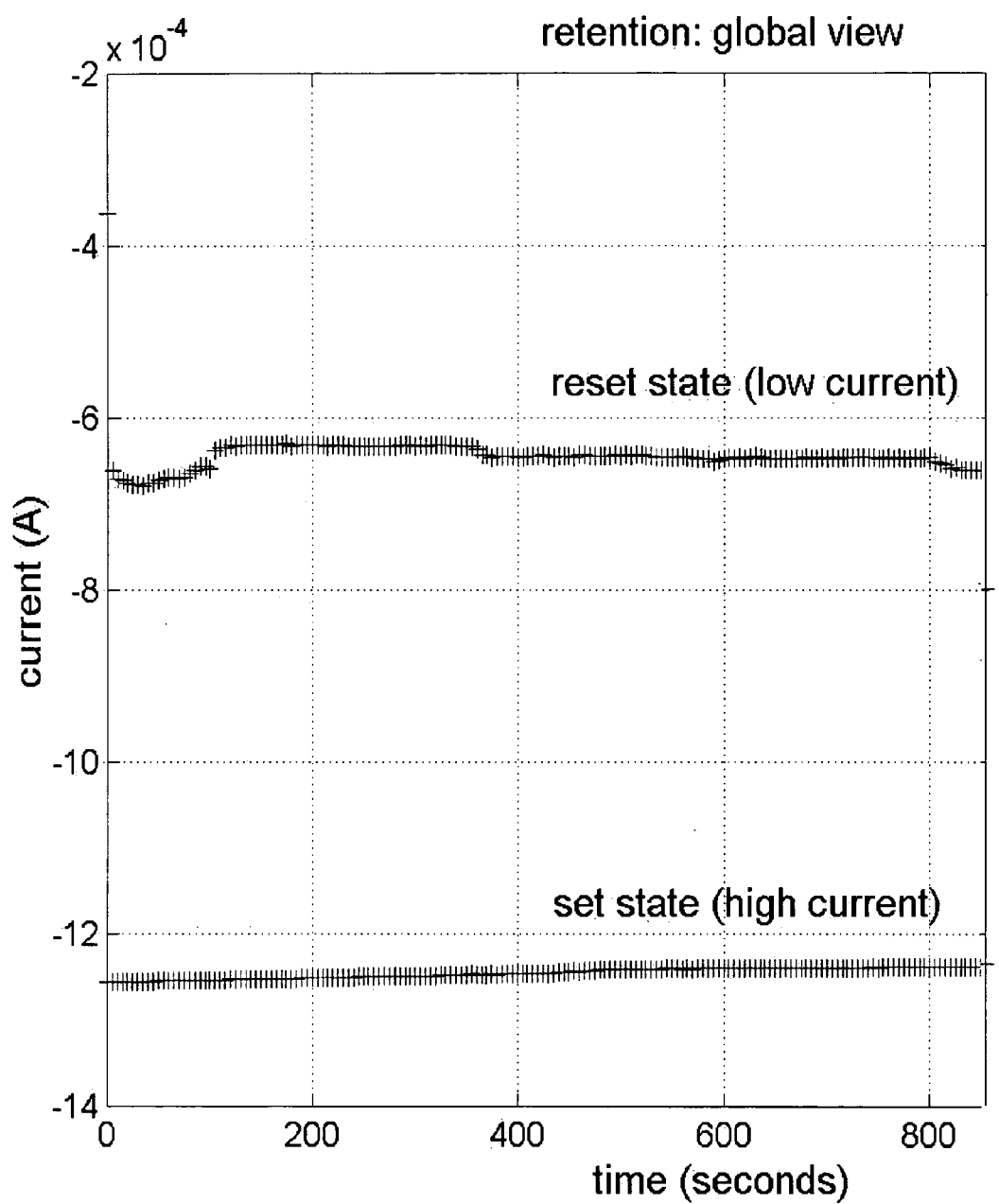
FIG. 9 illustrates a general view of the retention behavior of the set state (high current) and the reset state (low current) of BR-TEA based memory switches.

A general view of the retention characteristics is presented in FIG. 9. 5 s sampling time has been chosen in order to check any variation in the device resistance; −100 mV reading voltage is supposed to be much lower than the set/reset voltage, so that the measurement itself should not disturb the device. From FIG. 9, in the measured time window, the set state (low resistance) appears to be stable as the reset state (high resistance).

Comparative Bistable Memory Switch 1

An organic bistable memory switch was prepared in the same manner as bistable memory switch 1, except that Bengal Rose disodium salt (BR—Na) was used as the material for the organic thin film. In this case, to improve the films homogeneity the samples have been annealed at 150° C. for 12 h under vacuum.

Figure 10A:
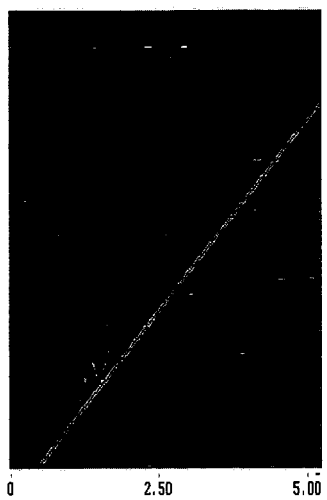
FIGS. 10a and 10b illustrate the morphology of Bengale Rose-disodium (BR—Na) films (5×5 micron) before and after the annealing processes respectively.
Figure 10A:
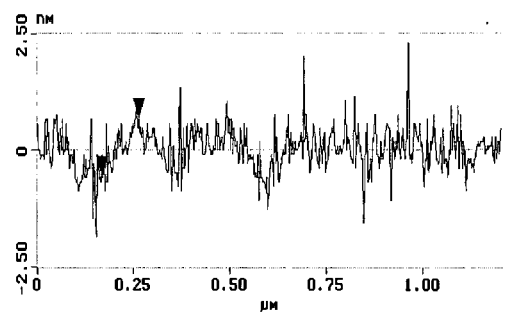
Figure 10B:
Figure 10B:
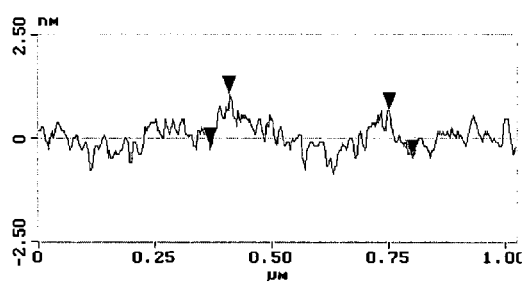

The morphology of BR—Na films has been studied by AFM. FIGS. 10a and 10b report the section analysis of BR-TEA films before (FIG. 10a) and after (FIG. 10b) the annealing process. Also in this case, AFM measurements show that the annealing treatment provokes an increase of the flattening of the films. Indeed, the related RMS values decrease from 0.61 for the not annealed films to 0.5 nm for the annealed ones.

Figure 11:
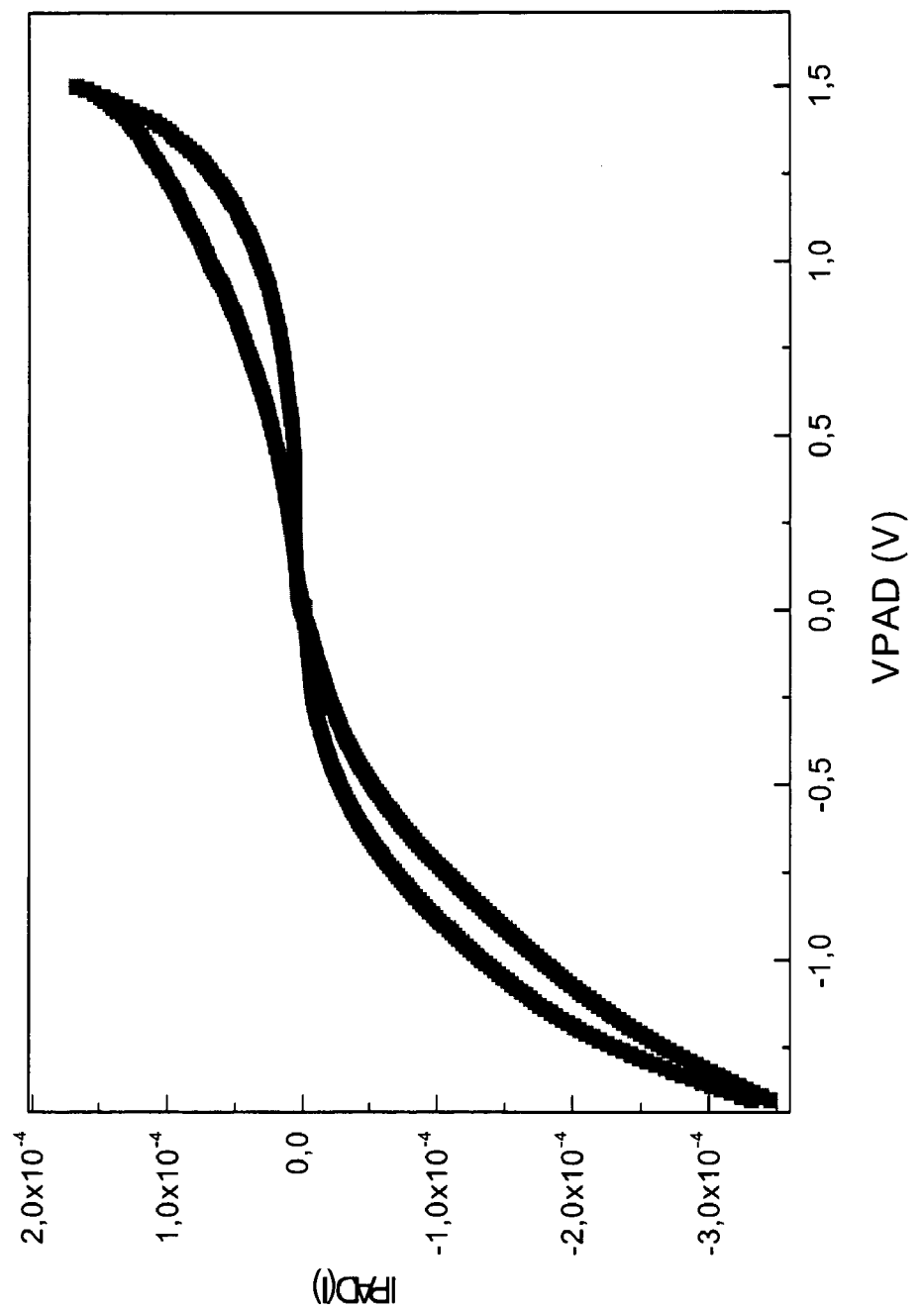
FIG. 11 illustrates the current-voltage (I-V) characteristic of the BR—Na based memory switch.

For this organic bistable memory switch, no bistable characteristic has been observed but a very little hysteretic effect mainly due to ions movement. FIG. 11 depicts the IV curve obtained on such a memory switch by using the same experimental set up of the bistable memory switch 1.

FI-TEA Bistable Memory Switch 2

An organic device shown in FIG. 2 was prepared according to the procedure described in the bistable memory switch 1 except that FI-TEA was used as the material for the organic film. Some samples have been annealed at 80° C. for 8 h under vacuum, some samples have been annealed at 50° C. for 8 h under vacuum and some samples has been used without any annealing process.

The electrical measurements performed, by using the same experimental set up reported in bistable memory switch 1 (room temperature, in air, by using Agilent 4155C semiconductor parameter analyzer, used in sweep mode to measure the device characteristics and sampling mode to measure the device resistance and the device retention; and Hp81110A pulse generator used to set/reset the status) are:
1. transcharacteristics performed between −1.8 V to 1.8 V, with double setting, in order to get any hysteresis if any is present. These characteristics have been performed only on one sample and here not reported, as they can be destructive towards the sample itself. They have been done in order to get the typical set-reset voltages and the typical device current.
2. the best set-reset conditions that have been found are:
    a. set voltage: +1.5 V
    b. reset voltage: −1.5 V
    c. set pulse length: 10 ms
    d. reset pulse length: 10 ms
    e. current compliance: 20 mA
Reading is performed at −300 mV. To be carefully observed that, on these samples, the set voltage (from high→low resistance) is positive, while the reset voltage (from low→high resistance) is negative.
3. some manual cycling has been performed; after this, short time retention test has been performed at room temperature, that is:
    a. the memory is left in reset state
    b. every second the memory state is read till 1000 seconds
    c. the memory is switched into set state
    d. every second the memory state is read till 1000 seconds
    e. the memory is finally switched again The measurements show both bistable IV characteristics and retention characteristics.

Figure 12:
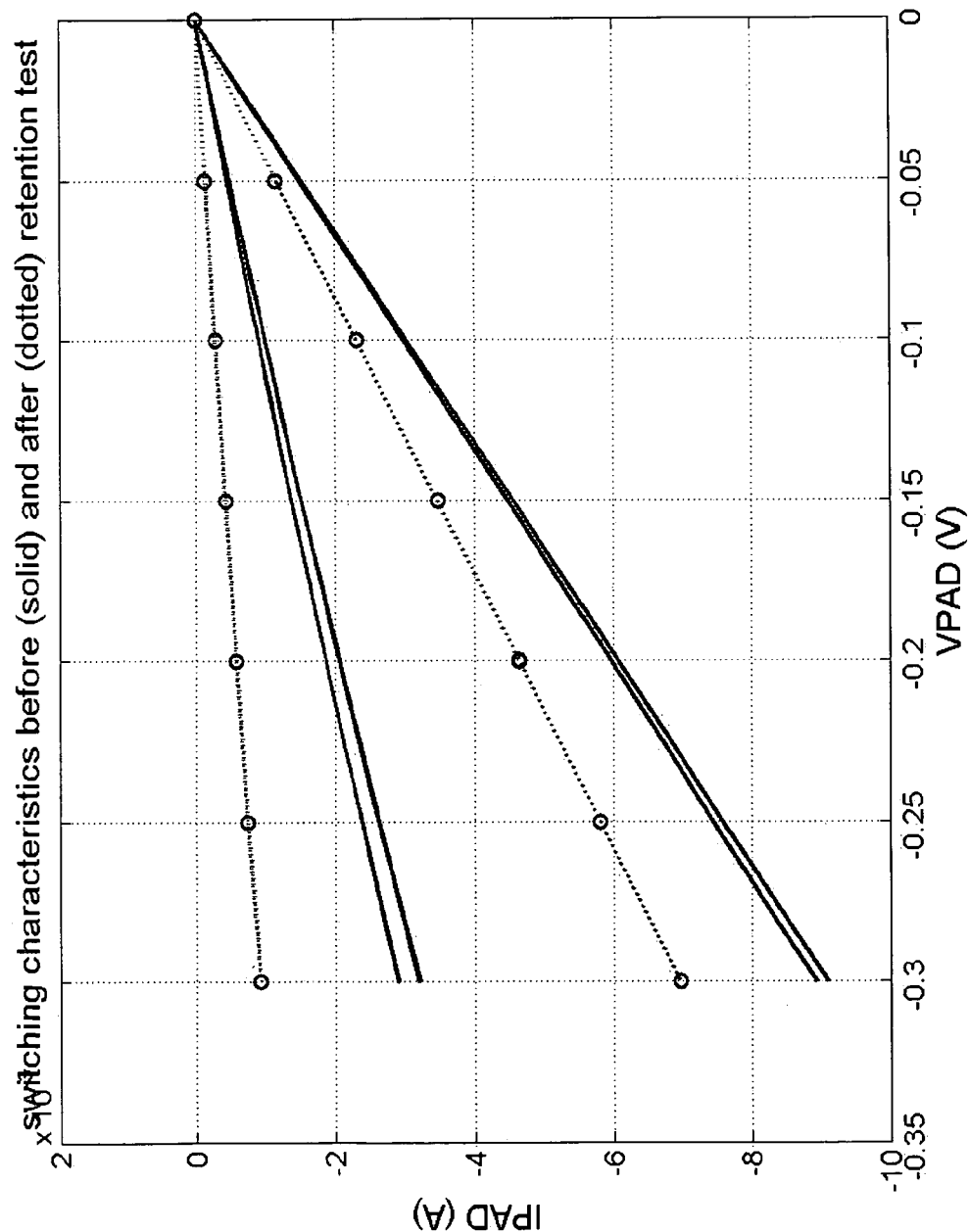
FIG. 12 illustrates the current-voltage (I-V) characteristic of the Fluorosceine bis-triethylammonium (Fl-TEA) based memory switch before and after retention test.

FIG. 12 reports the measurements on not annealed FL-TEA memory switches (solid lines) showing a good cycling behavior. The resistance ratio between SET state and RESET state is something bigger than two. This value is stable.

After retention measurements, the memory window (dotted lines) appears to be similar as in the first measurements, even though a general reduction in current is observed, maybe due to some parasitic resistance.

Figure 13:
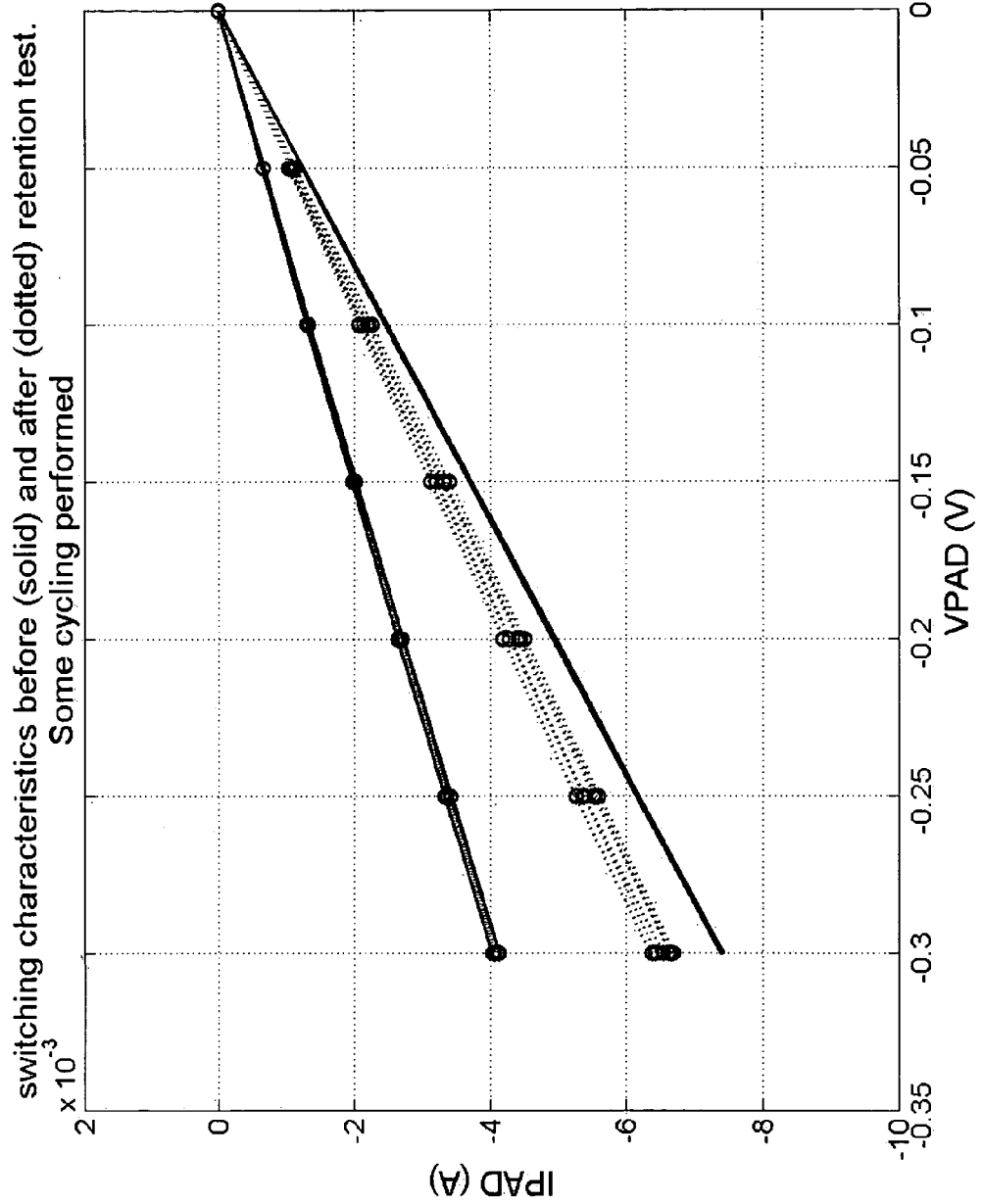
FIG. 13 illustrates the current-voltage (I-V) characteristic of the Fl-TEA based memory switch before and after retention test.

The measurements performed on FI-TEA memory switches annealed at 50 C (FIG. 13) show a much smaller memory window (the factor is much smaller than 2); the measurements performed after the retention test (dotted lines) show a reduced memory window, due mainly to the decreased set state current, while the reset state is constant. After some switching, the memory window doesn't seem to be influenced.

Finally, the measurements performed on FI-TEA memory switches annealed at 80 C don't show any switching behavior.

Comparative Bistable Memory Switch 2

An organic bistable memory switch was prepared in the same manner as in the bistable memory switch 2 except that Fluoresceine disodium salt (FI-Na) was used as the material for the organic thin film. In this case, to improve the films homogeneity the samples have been annealed at 150° C. for 12 h under vacuum.

For this organic bistable memory switch, no bistable characteristic has been observed but a very little hysteretic effect mainly due to Na+ ions movement. The IV curve obtained on such a device is qualitatively the same of comparative bistable memory switch 1 and reported in FIG. 11.

Ey-TEA Bistable Memory Switch 3

An organic device shown in FIG. 2 was prepared according to the procedure described in the bistable memory switch 2 except that Ey-TEA was used as the material for the organic thin film.

The electrical measurements performed, by using the same experimental set up reported in bistable memory switch 2 show both bistable IV characteristics and retention characteristics similar to those of bistable memory switch 2.

Comparative Bistable Memory Switch 3

An organic bistable memory switch was prepared in the same manner as in the bistable memory switch 3 except that Eosyne Y disodium salt (Ey-Na) was used as the material for the organic thin film. To improve the films homogeneity the samples have been annealed at 150° C. for 12 h under vacuum.

For this organic bistable memory switch, no bistable characteristic has been observed but a very little hysteretic effect mainly due to ions movement. The IV curve obtained on such a device is qualitatively the same of comparative bistable memory switch 1 and reported in FIG. 11.

PH-TEA Bistable Memory Switch 4

An organic device shown in FIG. 2 was prepared according to the procedure described in the bistable memory switch 2 except that PH-TEA was used as the material for the organic thin film.

The electrical measurements performed, by using the same experimental set up reported in bistable memory switch 2 show both bistable IV characteristics and retention characteristics similar to those of bistable memory switch 2

Comparative Bistable Memory Switch 4

An organic bistable memory switch was prepared in the same manner as in the bistable memory switch 4 except that Phloxine disodium salt (PH-Na) was used as the material for the organic thin film. To improve the films homogeneity the samples have been annealed at 150° C. for 12 h under vacuum.

For this organic bistable memory switch, no bistable characteristic has been observed but a very little hysteretic effect mainly due to ions movement. The IV curve obtained on such a device is qualitatively the same of comparative bistable memory switch 1 and reported in FIG. 11.

According to embodiments of the present invention, thanks to the organic electrically bistable materials based on fluoresceine derivatives having organic cations as countercation, it is ensured low cations mobility, avoiding the presence of ionic currents that are responsible for electrical drawbacks such as transient bistable behaviors, and decreasing of ON/OFF ratios, etc.

The low ionic current offers the benefit to obtain memory switch, which are suitable for electronic applications, especially for memory devices:

Moreover, fluoresceine derivatives having organic cations as countercation are low cost and easy to process avoiding an increase in production process steps.

These materials are compatible to electrode materials given that they do not produce any phenomena of electrode poisoning such as migration into electrode etc.

Moreover, these materials operate at low drive voltage.

An organic film according to embodiments of the present invention is formed of a single component, namely the fluoresceine derivative.

The presence of a single component enables the film to be, in principle, scaled down till "single molecule".

It represents a good starting point for the production of molecular memory nano-devices.

An embodiment of the invention has a laminate structure comprising the first and second electrodes, between which a thin film of the fluoresceine-salt is sandwiched. The laminate structure is easy to be handled.

In this regard, a method according to an embodiment of the invention enables obtaining a film of fluoresceine salt having a thickness of the film, generally on the order of 5 to 1000 nm.

The control of the thickness is mainly connected to spin coating step or to the vacuum evaporation step on bottom electrode to form the film.

An embodiment of the invention provides switching from a high impedance state to a low impedance state by applying an electric field of any polarity.

The magnitude of the applied bias is low (|1-2V|). As a matter of fact thanks to the invention, switching back to the high impedance state is achieved by introducing a pulse of polarity opposite that of the previously applied electric field.

This enables to provide a device, which acts as an organic, electrochemical storage cell when passing from a low to a high impedance state.

Embodiments of the present invention provide reliable and reproducible switching in a memory mode.

From the foregoing it will be appreciated that, although specific embodiments of the invention have been described herein for purposes of illustration, various modifications may be made without deviating from the spirit and scope of the invention.

The invention claimed is:

1. A memory switch comprising a fluoresceine derivative having the formula:

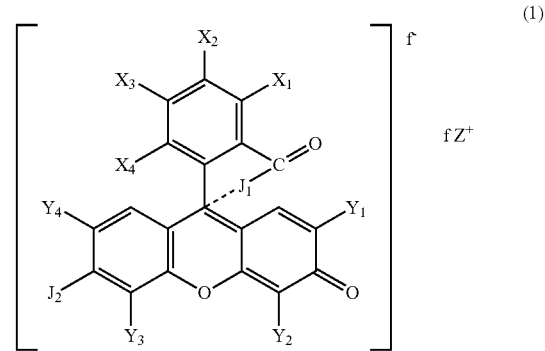

wherein
— $X_1$, $X_2$, $X_3$, $X_4$ and $Y_1$, $Y_2$, $Y_3$, $Y_4$ are independently H, an electron withdrawing group, an alkyl, aryl, aralkyl, alkenyl, or alkynyl group, or a heterocyclic group;
the dashed line represents a covalent bond or no bond;
$J_1$, is
 O (oxygen), when the dashed line represents a covalent bond, and
 a O—K group or O$^-$, when the dashed line represents no bond; and
$J_2$ is independently an O—K group or O$^-$;
wherein K is independently H, an alkyl, aryl, aralkyl, alkenyl, or alkynyl group, a trialkyl-silyl group, a benzensulfonyl group, or a heterocyclic group,
and $Z^+$ is a sulfonate cation having the formula $R_a$—$SO_2^+$, wherein $R_a$ is an alkyl group with 1 to 30 carbon atoms, provided that at least one of $J_1$ and $J_2$ is a O$^-$ and then f is 1 or 2,
with the further proviso that the sulfonate cation is not a cationic polymer.

2. The memory switch according to claim 1, wherein the electron withdrawing group is selected from F, Cl, Br, I, CN, $NO_2$, COR, CHO, COOH, COOR, $CF_3$, COCl, $NH_3^+$, $NR_3^+$, $NO_2$, $SO_2R$, SCN, $CCl_3$, $SO_3H$ RCONR, or a thio-amidic group of formula RCSNR.

3. The memory switch according to claim 2, wherein R is an alkyl, aryl, aralkyl, alkenyl, or alkynyl group or a heterocyclic group.

4. The memory switch according to claim 2, wherein R is an aliphatic chain.

5. The memory switch according to claim 1, wherein the fluoresceine derivative is a fluoresceine salt, wherein $X_1$, $X_2$, $X_3$, $X_4$ and $Y_1$, $Y_2$, $Y_3$, $Y_4$ are H and the dashed line represents no bond wherein both $J_1$ and $J_2$ are O$^-$.

6. The memory switch according to claim 1, wherein the fluoresceine derivative is an eosine Y salt, wherein $X_1$, $X_2$, $X_3$, $X_4$ are H, $Y_1$, $Y_2$, $Y_3$, $Y_4$ are Br, and the dashed line represents no bond, wherein both $J_1$ and $J_2$ are O$^-$.

7. The memory switch according to claim 1, wherein the fluoresceine derivative is a phloxine salt, wherein $X_1$, $X_2$, $X_3$, $X_4$ are Cl, $Y_1$, $Y_2$, $Y_3$, $Y_4$ are Br and the dashed line represents no bond, wherein both $J_1$ and $J_2$ are O$^-$.

8. The memory switch according to claim 1, wherein the fluoresceine derivative is Bengale Rose salt, wherein $X_1$, $X_2$, $X_3$, $X_4$ are Cl, $Y_1$, $Y_2$, $Y_3$, $Y_4$ are I, and the dashed line represents no bond, wherein both $J_1$ and $J_2$ are O$^-$.

9. The memory switch according to claim 1, which further comprises two electrodes between which the film is sandwiched to form a laminate structure.

10. The memory switch according to claim 1, wherein the film has a thickness of about 5 to 1000 nm.

11. The memory switch according to claim 9, wherein each of the two electrodes are made of a metallic film.

12. The memory switch according to claim 9, wherein each of the two electrodes are made of an electrically conductive organic film.

13. The memory switch according to claim 9, wherein each of the two electrodes are made of a film of electrically conductive perovskite oxide.

14. The memory switch according to claim 9, wherein the memory switch further comprises a substrate, and one of the two electrodes is stacked in contact with the top of the substrate.

15. The memory switch according to claim 14, wherein the substrate is made of an inorganic rigid material.

16. The memory switch according to claim 14, wherein the substrate is made of an organic material.

17. A memory device comprising the memory switch according to claim 1.

18. A method for producing a memory switch comprising two electrodes, wherein the method comprises the step of coating one of the electrodes with a film made of the fluoresceine derivative according to claim 1.

19. The method according to claim 18, wherein the coating step is a spin coating step, during which the fluoresceine derivative is spun on the surface of one of the electrodes.

20. The method according to claim 18, wherein the coating step is performed by means of vacuum deposition of the fluoresceine derivative on the surface of one of the electrodes.

21. The method according to claim 18, wherein, after the coating step, the method further comprises a step of annealing the film.

22. An array of memory switches, comprising:
a substrate;
a plurality of memory switches formed over the substrate to form the array, each of the memory switches comprising,
a first electrode formed over the substrate;
a fluoresceine derivative layer formed over the first electrode, the fluoresceine derivative layer having the formula:

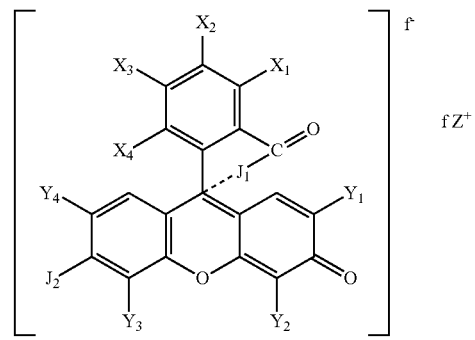

wherein
—$X_1$, $X_2$, $X_3$, $X_4$ and $Y_1$, $Y_2$, $Y_3$, $Y_4$ are independently H, an electron withdrawing group, an alkyl, aryl, aralkyl, alkenyl, or alkynyl group, or a heterocyclic group;
the dashed line represents a covalent bond or no bond;
$J_1$, is
O (oxygen), when the dashed line represents a covalent bond, and
a O—K group or O$^-$, when the dashed line represents no bond; and
$J_2$ is independently an O—K group or O$^-$;
wherein K is independently H, an alkyl, aryl, aralkyl, alkenyl, or alkynyl group, a trialkyl-silyl group, a benzensulfonyl group, or a heterocyclic group,
and Z$^+$ is a sulfonate cation having the formula $R_a$—SO$_2^+$, wherein $R_a$ is an alkyl group with 1 to 30 carbon atoms,
provided that at least one of $J_1$ and $J_2$ is a O$^-$ and then f is 1 or 2,
wherein the sulfonate cation is not a cationic polymer and;
a second electrode layer formed over the fluoresceine derivative layer.

23. The array of memory switches of claim 22 wherein each of the first and second electrodes is made of a metallic film.

24. The array of memory switches of claim 22 wherein the first electrode is formed on the substrate.

25. The array of memory switches of claim 22 wherein the substrate comprises an inorganic rigid material.

* * * * *